United States Patent
Moon et al.

(10) Patent No.: US 12,398,229 B2
(45) Date of Patent: Aug. 26, 2025

(54) HIGH PERFORMANCE SELF-HEALING POLYMER GEL ELECTROLYTE CONTAINING IONIC SIDE BRANCHES

(71) Applicant: University of Seoul Industry Cooperation Foundation, Seoul (KR)

(72) Inventors: Hong Chul Moon, Seoul (KR); Yong Min Kim, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 779 days.

(21) Appl. No.: 17/544,148

(22) Filed: Dec. 7, 2021

(65) Prior Publication Data

US 2022/0177623 A1  Jun. 9, 2022

(30) Foreign Application Priority Data

Dec. 7, 2020 (KR) .................. 10-2020-0169718
Dec. 3, 2021 (KR) .................. 10-2021-0172140

(51) Int. Cl.
| | | |
|---|---|---|
| *C08F 220/60* | (2006.01) | |
| *G01L 1/00* | (2006.01) | |
| *H10K 50/84* | (2023.01) | |
| *H10K 59/80* | (2023.01) | |
| *H10K 85/10* | (2023.01) | |

(52) U.S. Cl.
CPC ........ *C08F 220/60* (2013.01); *C08F 220/606* (2020.02); *G01L 1/005* (2013.01); *H10K 59/8051* (2023.02); *H10K 59/8052* (2023.02); *H10K 85/141* (2023.02); *H10K 85/151* (2023.02); *C08F 2800/10* (2013.01); *C08F 2810/00* (2013.01); *H10K 50/84* (2023.02)

(58) Field of Classification Search
CPC .............. C08F 220/606; C08F 2800/10; C08F 2810/00; C08F 220/60; G01L 1/005; H10K 85/141; H10K 85/151; H10K 50/84; H10K 59/8051; H10K 59/8052
See application file for complete search history.

(56) References Cited

U.S. PATENT DOCUMENTS

2004/0054041 A1* 3/2004 Schmidt .................. C08K 5/50
524/106

FOREIGN PATENT DOCUMENTS

| KR | 101957629 B1 | 3/2019 |
|---|---|---|
| KR | 102094273 B1 | 3/2020 |

OTHER PUBLICATIONS

Mendonça, Patrícia V. et al; "Deep eutectic solvents (DES): Excellent green solvents for rapid SARA ATRP of biorelevant hydrophilic monomers at ambient temperature"; Polymer, 2017, vol. 132, pp. 114-121.

* cited by examiner

*Primary Examiner* — Andrew J. Oyer
(74) *Attorney, Agent, or Firm* — Jackson Walker LLP

(57) ABSTRACT

Disclosed in the present specification is a high-performance self-healing polymer cell electrolyte comprising ionic side branches. The polymer gel electrolyte comprises: a copolymer comprising an ionic domain and a non-ionic domain; and an ionic liquid, and having a plurality of ion clusters (ICs) formed as an ionic moiety of the ionic domain is bonded to the ionic liquid.

12 Claims, 46 Drawing Sheets

+ [EMI][TFSI]

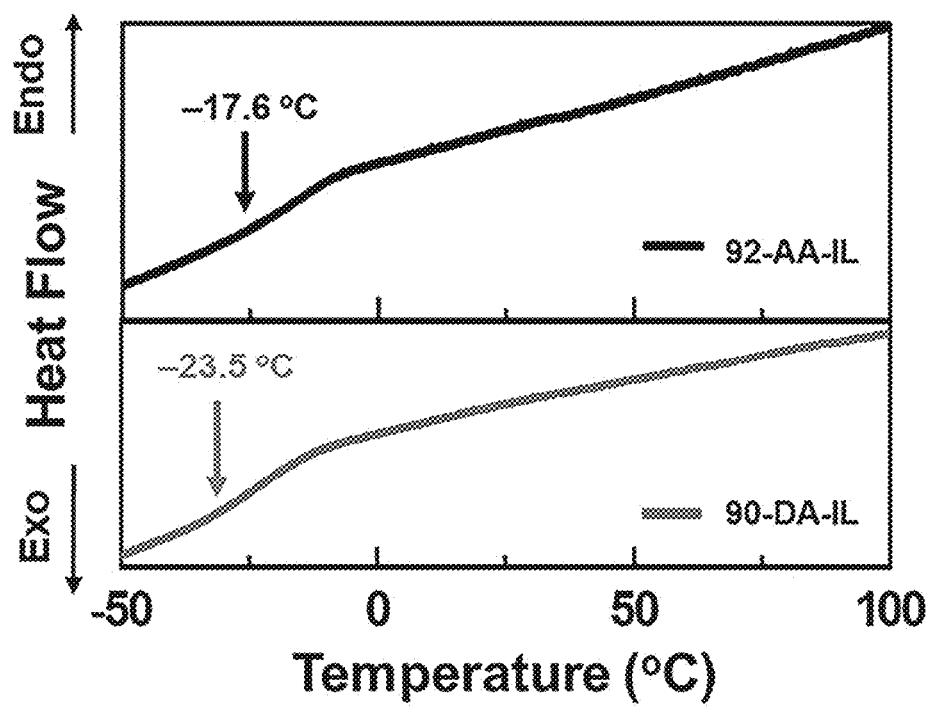

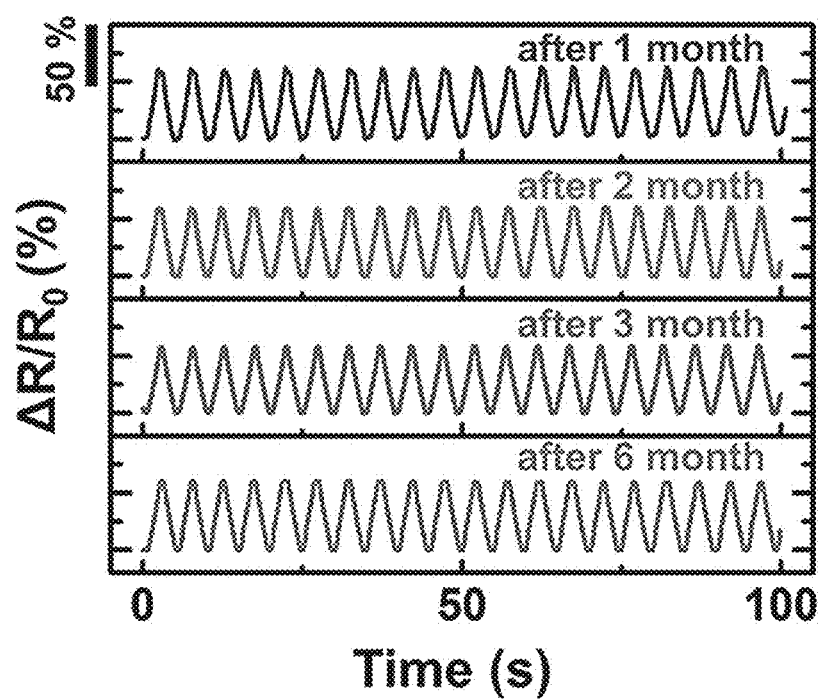

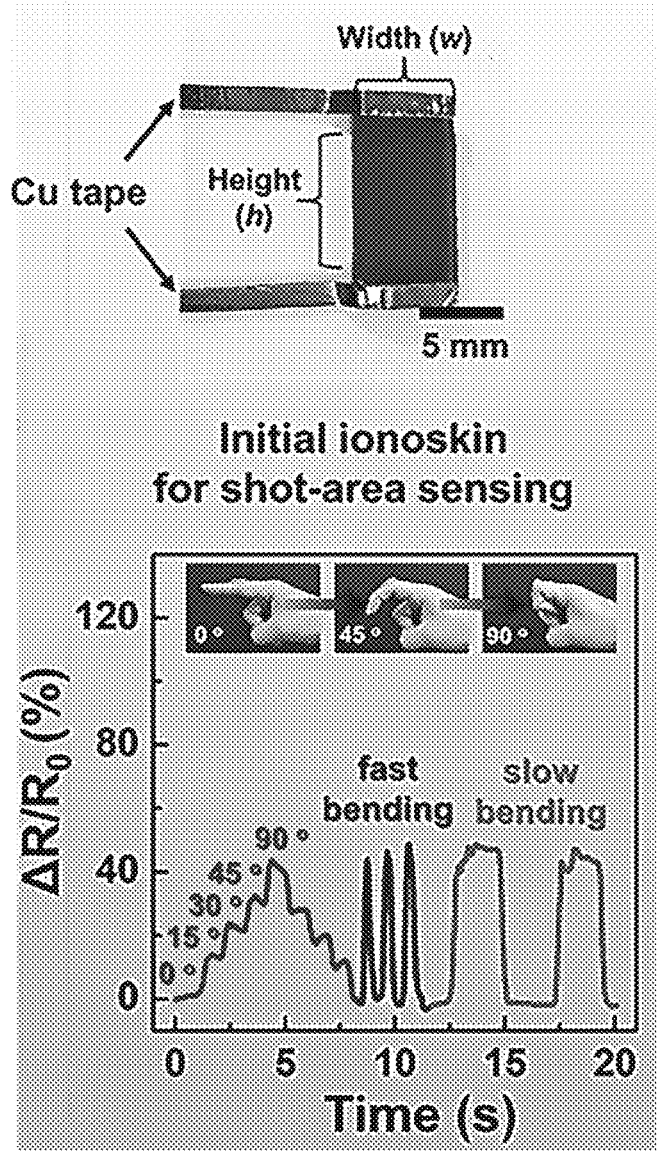

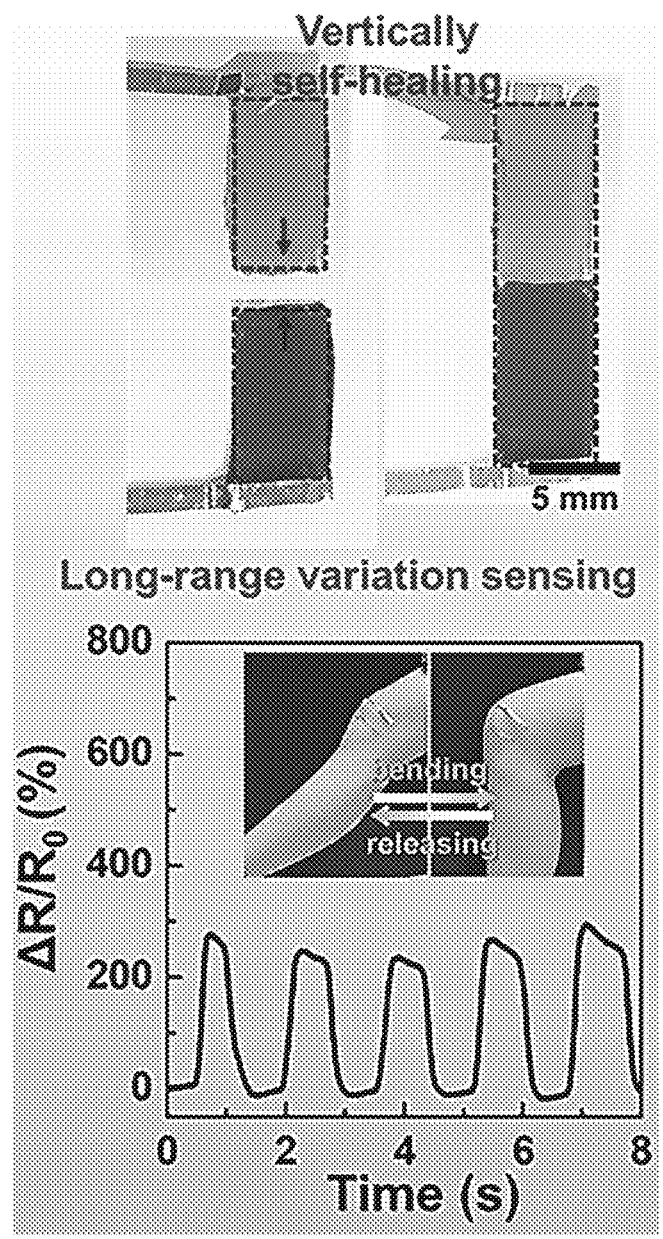

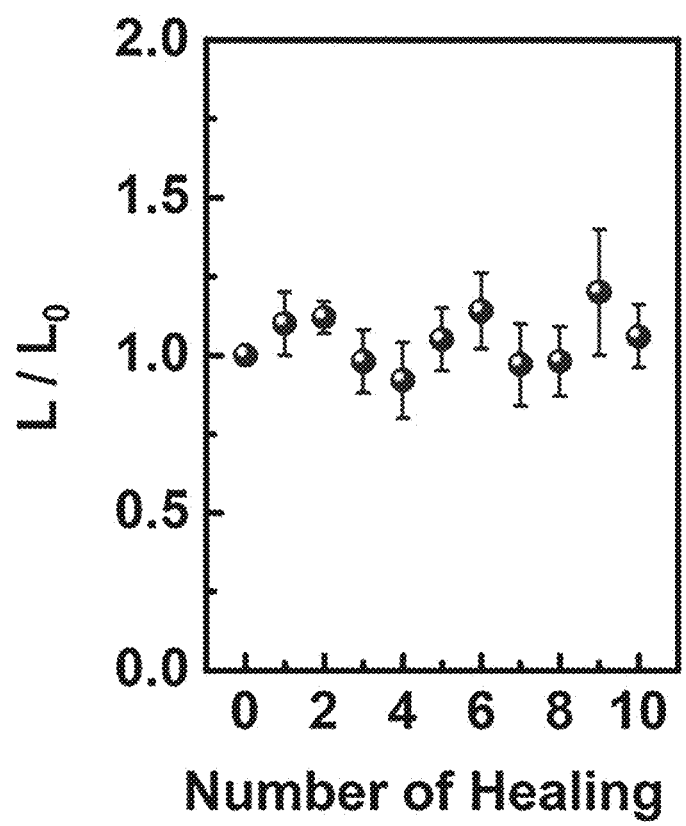

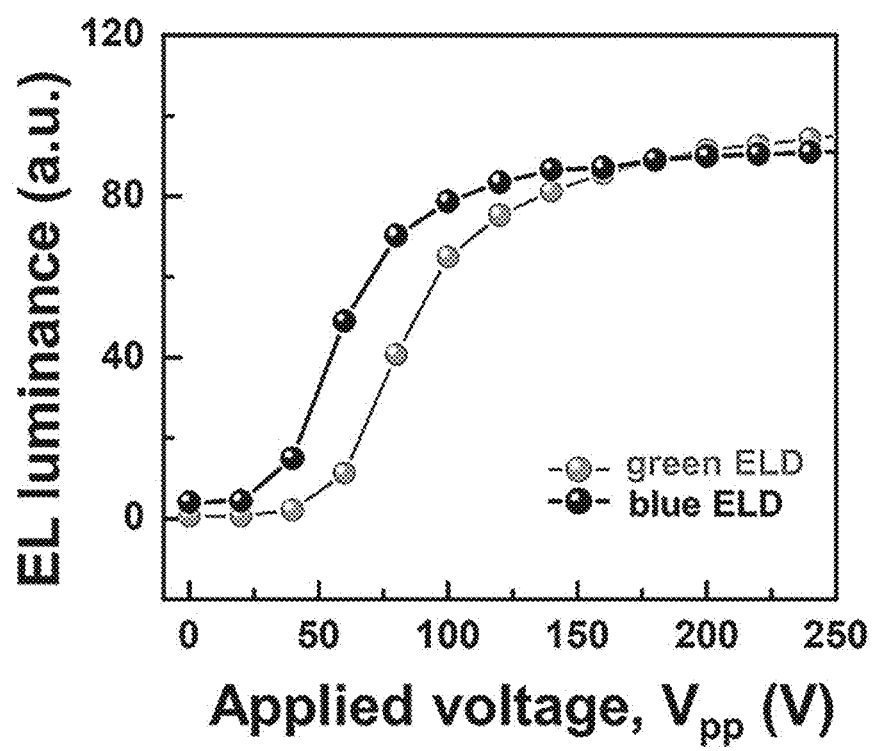

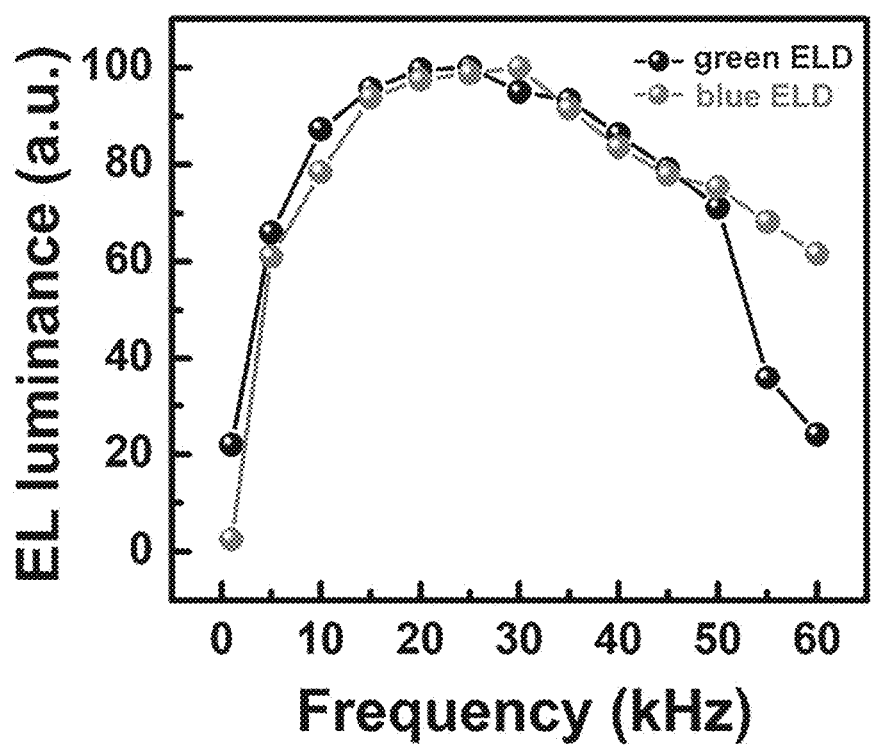

HIGH PERFORMANCE SELF-HEALING POLYMER GEL ELECTROLYTE CONTAINING IONIC SIDE BRANCHES

CROSS-REFERENCE TO RELATED APPLICATION

This application claims the priority of Korean Patent Application No. 10-2020-0169718 filed on Dec. 7, 2020 and Korean Patent Application No. 10-2021-0172140 filed on Dec. 3, 2021, the contents of which in their entirety are herein incorporated by reference.

BACKGROUND

1. Field

The present specification discloses a high-performance self-healing polymer cell electrolyte containing ionic side branches.
[National R&D program for supporting invention]
[Project ID No.]1711120360
[Project No.]2020M3D1A2102869
[Ministry in charge] Ministry of Science and ICT
[Supervisory agency] National Research Foundation
[Research project name] Support for discovery of future materials (R&D)
[Research Title] Development of high-performance electrochromic transparent display materials and devices for vehicles
[Contribution rate]1/1
[Research institute] University of Seoul
[Research period] From Jul. 23, 2020 to Dec. 31, 2023

2. Description of the Related Art

An electrolyte is a basic component for various electrochemical devices such as lithium-ion batteries, electrolyte-gated transistors, galvanic skin and electrochromic (EC) or electrochemiluminescent devices.

Ionic conductivity and mechanical robustness are two important factors in the evaluation of electrolytes. High ionic conductivity directly leads to low-voltage operation (i.e., low voltage drop) and fast response of the electrochemical device. Moreover, the use of mechanically strong polymer gel electrolytes (PGEs) enables the implementation of flexible or stretchable devices, unlike conventional liquid electrolytes having leakage problems. However, these two characteristics generally have a trade-off relationship. Thus, designing and manufacturing of balanced PGEs is a challenge for high-performance electrochemical devices.

The existing ion gels consisting of block copolymers and ionic liquids (ILs) are drawing a lot of attentions as promising PGEs due to non-volatility, high ionic conductivity, controllable mechanical properties and superior electrochemical stability. In principle, the block copolymers for ion gels should contain both IL-insoluble blocks and IL-soluble blocks. For example, representative ABA triblock copolymers such as polystyrene (PS)-block-poly(ethylene oxide)-block-polystyrene (PS) (SOS) and PS-block-poly(methyl methacrylate)-block-PS (SMS) have short PS terminal blocks which are insoluble in 1-ethyl-3-methylimidazolium bis(trifluoromethylsulfonyl)imide ([EMI][TFSI]) and midblocks of PEO or PMMA which are soluble in [EMI][TFSI]. When the triblock copolymers having such a structure are blended with ILs, IL-insoluble parts such as PS agglomerate into spheres with minimal surface areas to decrease enthalpic penalty. This process can improve the mechanical resilience of the ion gel. On the other hand, IL-soluble midblocks swollen with ILs provide ion-conductive channels for electrochemical reactions.

Conventional physically crosslinked ion gels exhibited moderate mechanical robustness (elastic modulus of a few kPa) with good ionic conductivity (1-10 mS/cm) at room temperature. One important requirement for achieving these values is that the IL-insoluble spheres should be directly connected by a small amount of the midblocks to form a network structure. In this context, ABC triblock copolymers with IL-insoluble A and C blocks are suitable, but AB diblock copolymers cannot serve as an efficient polymer host. That is to say, although mechanical modulus can be enhanced without sacrificing ionic conductivity by selective chemical crosslinking of IL-insoluble blocks, this complicates copolymer synthesis.

Accordingly, development of a copolymer which is mechanically robust and has superior conductivity and thus can be applied for high-performance ion gels is necessary.

SUMMARY

In an aspect, provided are a copolymer which is mechanically robust and has superior conductivity and thus can be applied for high-performance ion gels, and an ion gel containing the same.

In another aspect, provided are a copolymer applicable to high-performance ion gels, which is super-stretchable (~1100%) and has ultrafast (within 1 minute) self-healing property (90% or higher recovery), and an ion gel comprising the same.

In another aspect, provided are a copolymer applicable to high-performance ion gels, which is stable even after hundreds of deformation cycles under room-temperature, normal-pressure conditions and exhibits self-healing ability, and an ion gel comprising the same.

In an exemplary embodiment, the present disclosure provides a random copolymer represented by Chemical Formula 1, which is used for a polymer gel electrolyte.

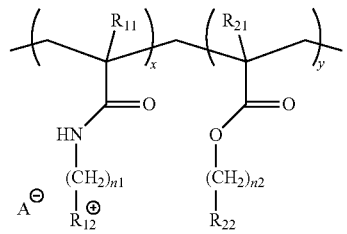

[Chemical Formula 1]

Here, each of $R_{11}$ and $R_{21}$ may independently be an alkyl group, $R_{12}$ may be a cationic functional group, and $R_{22}$ may comprise a hydroxyl group or hydrogen (H), and each of n1 and n2 may independently be an integer from 1 to 8.

Also, in an exemplary embodiment, the present disclosure provides a polymer gel electrolyte comprising: a copolymer comprising an ionic domain and a non-ionic domain; and an ionic liquid, and having a plurality of ion clusters (ICs) formed as an ionic moiety of the ionic domain is bonded to the ionic liquid.

In an exemplary embodiment, the copolymer may be a Random copolymer represented by Chemical Formula 1.

[Chemical Formula 1]

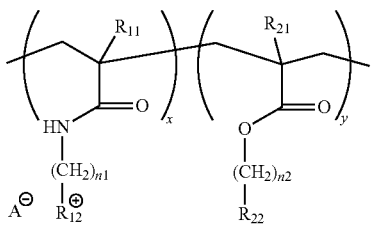

Here, each of $R_{11}$ and $R_{21}$ may independently be an alkyl group, $R_{12}$ may be a cationic functional group, and $R_{22}$ may comprise a hydroxyl group or hydrogen (H), and each of n1 and n2 may independently be an integer from 1 to 8.

In an exemplary embodiment, in the above chemical formula, each of $R_1$ and $R_{21}$ may independently be selected from hydrogen (H), a methyl group ($CH_3$), an ethyl group ($C_2H_5$), a propyl group ($C_3H_7$), a butyl group ($C_4H_8$), a pentyl group ($C_5H_{11}$) and a hexyl group ($C_6H_{13}$), and $R_{12}$ may be selected from an ammonium group, an imidazolium group, a diallyldimethylammonium group, a pyridinium group and a phosphonium group.

In an exemplary embodiment, the copolymer may be particularly a random copolymer represented by Chemical Formula 2.

[Chemical Formula 2]

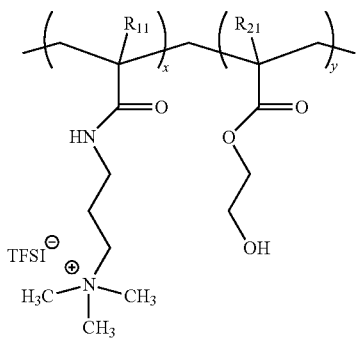

In an exemplary embodiment, the polymer gel electrolyte may self-heal through formation and dissociation of ion clusters.

In an exemplary embodiment, mole fraction of the ionic domain and the non-ionic domain in the copolymer may be in a range from 80:20 to 95:5.

In an exemplary embodiment, the ionic liquid may be one or more selected from N-methyl-N-butyl-pyrrolidinium bis-trifluoromethylsulfonylimide ([$P_{14}$][TFSI]), 1-ethyl-3-methylimidazolium bis(trifluoromethylsulfonyl)imide ([EMI][TFSI]), 1-ethyl-3-methylimidazolium hexafluorophosphate ([EMI][PF6]), 1-ethyl-3-methylimidazolium tetrafluoroborate ([EMI][BF4]), 1-butyl-3-methylimidazolium bis(trifluoromethylsulfonyl)imide ([BMI][TFSI]), 1-butyl-3-methylimidazolium hexafluorophosphate ([BMI][PF6]), 1-butyl-3-methylimidazolium tetrafluoroborate ([BMI][BF4]), 1-butyl-trimethylammonium bis(trifluoromethylsulfonyl)imide ([N1114][TFSI]) and methylpropylpyrrolidinium bis(trifluoromethylsulfonyl)imide ([PYR13][TFSI]).

In an exemplary embodiment, a molar ratio of the copolymer and the ionic liquid may be in a range from 3:7 to 7:3.

In an exemplary embodiment, the polymer gel electrolyte may undergo ion relaxation when a variable voltage (AC voltage) in a frequency range from $10^1$ to $10^7$ rad/s is applied in dielectric relaxation spectroscopy (DRS).

In an exemplary embodiment, the polymer gel electrolyte may have a glass transition temperature ($T_g$) of −20° C. or higher.

In an exemplary embodiment, the polymer gel electrolyte may exhibit self-healing efficiency of 90% or higher within 1 minute under the condition of room temperature and normal pressure.

In another exemplary embodiment, the present disclosure may provide an electronic device or an electrochemical device, which comprises the polymer gel electrolyte described above.

In an exemplary embodiment, the electronic device or the electrochemical device may be a strain sensor or an electroluminescent.

The random copolymer and the ion gel electrolyte comprising the same according to exemplary embodiments of the present disclosure are mechanically robust and have superior conductivity. In addition, they may be superstretchable (~1100%) and may have ultrafast (within 1 minute) self-healing property (90% or higher recovery). In addition, they may be stable and exhibit self-healing ability even after hundreds of deformation cycles under the condition of room temperature and normal pressure.

The random copolymer and ion gel electrolyte comprising the same may be widely applicable to various flexible, wearable and stretchable electrochemical devices comprising electrochromic devices and may be usefully used for next-generation human-robot interfaces capable of sensitively detecting the change of pressure or strain.

BRIEF DESCRIPTION OF THE DRAWINGS

The above and other aspects, features and advantages of the disclosed exemplary embodiments will be more apparent from the following detailed description taken in conjunction with the accompanying drawings in which:

FIG. 14B shows the result of measuring the glass transition temperature ($T_g$) of polymer gel electrolytes of Examples 3 and 4.

FIG. 17E shows the result of measuring the sensitivity of a polymer gel electrolyte of Example 3 (92-AA-IL) for a long period of time.

FIGS. 18A-18C show the performance of a strain sensor of Example 5.

FIGS. 20A-20D show the driving performance of an electroluminescent device according to an exemplary embodiment of the present disclosure before and after self-healing.

FIGS. 21A-21D show the luminescence performance of an electroluminescent device according to an exemplary embodiment of the present disclosure.

DETAILED DESCRIPTION

Figure 1:
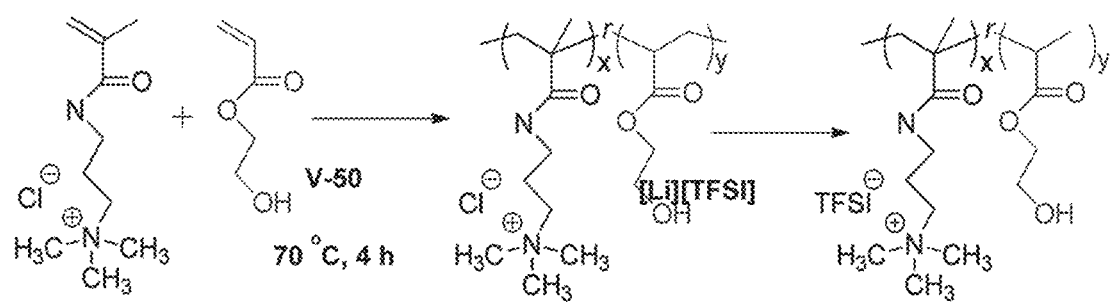
FIG. 1 shows a method for synthesizing a random copolymer comprising a cationic domain according to an exemplary embodiment of the present disclosure.

Hereinafter, exemplary embodiments of the present disclosure will be described in more detail.

The exemplary embodiments of the present disclosure described herein are provided only for the purpose of illustration. The exemplary embodiments of the present disclosure may be embodied in various forms and do not limit the present disclosure. In the description, details of features and techniques may be omitted to more clearly disclose the exemplary embodiments.

The present disclosure may be changed variously and may have various forms. The exemplary embodiments are not intended to limit the present disclosure and should be understood to include all changes, equivalents or substitutes encompassed in the idea and scope of the present disclosure.

The terminology used herein is for the purpose of describing particular embodiments only and is not intended to be limiting. As used herein, the singular forms "a," "an" and "the" are intended to include the plural forms as well, unless the context clearly indicates otherwise. Furthermore, the use of the terms a, an, etc. do not denote a limitation of quantity, but rather denotes the presence of at least one of the referenced item.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly defined so herein. All methods described herein can be performed in a suitable order unless otherwise indicated herein or otherwise clearly contradicted by context. The use of any and all examples, or exemplary language (e.g., "such as"), is intended merely to better illustrate the exemplary embodiments and does not pose a limitation on the scope of the present disclosure unless claimed otherwise. No language in the specification should be construed as indicating any non-claimed element as essential to the practice of the present disclosure as used herein.

It will be understood that the terms "comprise", "contain", "have", etc., when used in this specification, specify the presence of stated features, numbers, steps, operations, elements, components or combinations thereof, but do not preclude the presence or addition of one or more other features, numbers, steps, operations, elements, components or combinations thereof.

The polymer of an ion gel used in the exemplary embodiments of the present disclosure comprises an acrylate-based ionic domain and hydroxyl groups. The polymer constituting the ion gel electrolyte of the exemplary embodiments of the present disclosure is acrylate-based, unlike the existing styrene-based polymers. The use of the acrylate-based polymer which has a basically low glass transition temperature ($T_g$) can provide increased chain flexibility. Furthermore, the presence of the ionic domain, specifically a cationic domain such as ammonium, imidazolium, etc. and hydroxyl groups ensures superior ionic conductivity and mechanical property. In addition, a super-stretchable ion gel electrolyte with self-healing characteristic can be provided.

In the exemplary embodiments of the present disclosure, self-healing efficiency was compared depending on the presence of the ionic domain and the presence of the hydroxyl groups in order to investigate the principle of the ultrafast self-healing property of the polymer gel electrolyte. The designing of a self-healing ion gel based thereon is suggested here.

Polymer gel electrolyte and copolymer used therefor For this, in an exemplary embodiment, the present disclosure provides a polymer gel electrolyte comprising: a copolymer comprising an ionic domain and a non-ionic domain; and an ionic liquid, and having a plurality of ion clusters (ICs) formed as an ionic moiety of the ionic domain is bonded to the ionic liquid.

For example, the synthesis of poly([3-acryloamido-propyl]trimethylammonium)[TFSI])-random-2-hydroxyethyl acrylate (PAAMP-r-PHEA), which is a random copolymer having an ionic domain and hydroxyl groups at the same time, and an ion gel electrolyte having ultrafast self-healing ability and super-stretchable (~1100%) property at the same time using the same may be provided.

Through testing of super-stretchability and ultrafast self-healing ability depending on polymer structure and development of an ion gel electrolyte having self-healing ability based thereon, a strategy for polymer designing may be presented.

In addition, through hundreds of times of testing of tensile stress, self-healing ability and strain at low temperature, it may be used to develop galvanic skin for application to a human-robot interface.

In an exemplary embodiment, the copolymer used in the polymer gel electrolyte may be a random copolymer represented by Chemical Formula 1.

[Chemical Formula 1]

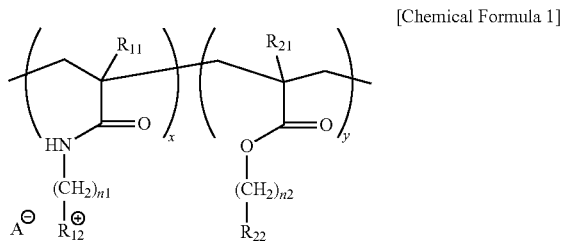

For example, each of $R_{11}$ and $R_{21}$ may independently be an alkyl group. Specifically, each of $R_{11}$ and $R_{21}$ may independently be selected from hydrogen (H), a methyl group ($CH_3$), an ethyl group ($C_2H_5$), a propyl group ($C_3H_7$), a butyl group ($C_4H_9$), a pentyl group ($C_5H_{11}$) and a hexyl group ($C_6H_{13}$). For example, $R_{12}$ may be a cationic functional group, e.g., one selected from an ammonium group, an imidazolium group, a diallyidimethylammonium group, a pyridinium group and a phosphonium group.

$R_{22}$ may comprise a hydroxyl group or hydrogen (H). For example, it may be a hydroxyl group and hydrogen bonding may be formed between the functional groups of the polymer chains.

Each of n1 and n2 may independently be an integer from 1 to 8. As the length of the chain is increased, the glass transition temperature ($T_g$) of the polymer may be decreased, the mechanical strength of the ion gel electrolyte may be decreased, and the ionic conductivity may be increased.

$A^-$ may be any anion, e.g., chloride ion ($Cl^-$), hexafluorophosphate ($[PF_6^-]$), tetrafluoroborate ($[BF_4^-]$), or bis(trifluoromethylsulfonyl)imide ([TFSI]).

In an exemplary embodiment, the copolymer may particularly be a random copolymer represented by Chemical Formula 2.

[Chemical Formula 2]

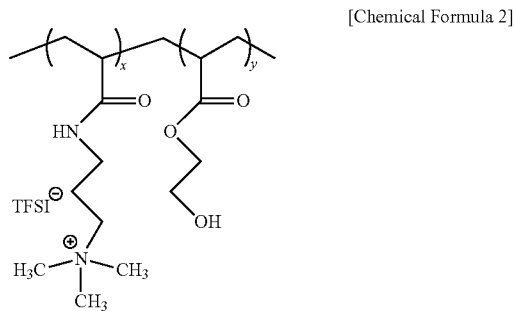

Therefore, the synthesis of poly([3-acryloamido-propyl]trimethylammonium)[TFSI])-random-2-hydroxyethyl acrylate (PAAMP-r-PHEA), which is a random copolymer having an ionic domain and hydroxyl groups at the same time, and an ion gel electrolyte having ultrafast self-healing ability and super-stretchable (~1100%) property at the same time using the same may be provided.

Figure 2:
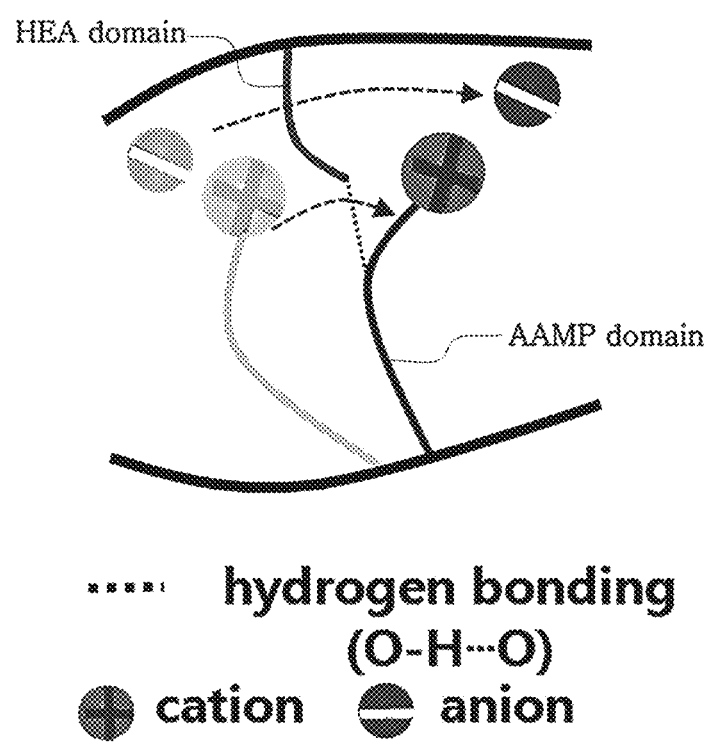
FIG. 2 schematically shows the mechanism whereby the mobility of a random copolymer comprising a cationic domain according to an exemplary embodiment of the present disclosure is improved.

As seen from FIG. 2, the random copolymer exhibits high stretchability due to the polymer chain having a low glass transition temperature in the ionic domain of the random copolymer and exhibits high ionic conductivity because the anion bound thereto moves together.

In an exemplary embodiment, the polymer gel electrolyte may self-heal through formation and dissociation of ion clusters. Specifically, the ion clusters (ICs) can be formed and dissociated very rapidly and, as a result, self-healing can occur quickly through the IC relaxation.

In an exemplary embodiment, in the copolymer, a mole fraction of the ionic domain and the non-ionic domain may be in a range from 80:20 to 95:5. When the mole fraction of the ionic domain and the non-ionic domain is lower than 80:20, self-healing ability may decrease. And, when it is higher than 95:5, mechanical strength may decrease.

In an exemplary embodiment, the ionic liquid may be pyridinium-based and/or imidazolium-based. Specifically, the ionic liquid may be one or more selected from a group consisting of N-methyl-N-butyl-pyrrolidinium bistrifluoromethylsulfonylimide ($[P_{14}]$[TFSI]), 1-ethyl-3-methylimidazolium bis(trifluoromethylsulfonyl)imide ([EMI][TFSI]), 1-ethyl-3-methylimidazolium hexafluorophosphate ([EMI][PF6]), 1-ethyl-3-methylimidazolium tetrafluoroborate ([EMI][BF4]), 1-butyl-3-methylimidazolium bis(trifluoromethylsulfonyl)imide ([BMI][TFSI]), 1-butyl-3-methylimidazolium hexafluorophosphate ([BMI][PF6]), 1-butyl-3-methylimidazolium tetrafluoroborate ([BMI][BF4]), 1-butyl-trimethylammonium bis(trifluoromethylsulfonyl)imide ([N1114][TFSI]) and methylpropylpyrrolidinium bis(trifluoromethylsulfonyl)imide ([PYR13][TFSI]).

In an exemplary embodiment, a molar ratio of the copolymer and the ionic liquid may be in a range from 3:7 to 7:3. When the molar ratio of the copolymer and the ionic liquid is lower than 3:7, mechanical strength may decrease. And, when it is higher than 7:3, self-healing ability and flexibility may decrease.

In an exemplary embodiment, the polymer gel electrolyte may undergo ion relaxation when a variable voltage (AC voltage) in a frequency range from $10^1$ to $10^7$ rad/s is applied in dielectric relaxation spectroscopy (DRS). In particular, despite the high glass transition temperature, ion cluster relaxation may occur in the high frequency range of $10^6$ rad/s or higher.

The polymer gel electrolyte may have a glass transition temperature ($T_g$) of −20° C. or higher. Despite the high glass transition temperature, it can have superior self-healing performance due to IC relaxation.

In an exemplary embodiment, the polymer gel electrolyte may exhibit self-healing efficiency of 90% or higher within 1 minute under the condition of room temperature and normal pressure.

In another exemplary embodiment, the present disclosure may provide an electronic device or an electrochemical device comprising the polymer gel electrolyte described above.

In an exemplary embodiment, the electronic device or the electrochemical device may be a strain sensor or an electroluminescent device.

In another exemplary embodiment, the present disclosure provides a method for preparing the polymer gel electrolyte described above, which comprises: a step of preparing a copolymer by copolymerizing a mixture comprising an ionic monomer and a non-ionic monomer; and a step of blending the copolymer with an ionic liquid.

Through testing of super-stretchability and ultrafast self-healing ability depending on polymer structure and development of an ion gel electrolyte having self-healing ability based thereon, a strategy for polymer designing may be presented.

In addition, through hundreds of times of testing of tensile stress, self-healing ability and strain at low temperature, it may be used to develop galvanic skin for application to a human-robot interface.

EXAMPLES

Hereinafter, the present disclosure is described in more detail through examples. However, the examples are provided only to help understanding of the present disclosure and the scope of the present disclosure is not limited by the examples.

Example 1: Preparation of Random Copolymer (92-AA)

A method for synthesizing a random copolymer comprising a cationic domain is described referring to FIG. 1. First, [AATA][Cl] (14.73 g, 71.28 mmol), 2-HEA (0.084 g, 0.72 mmol) and the initiator V-50 (9.7 mg, 0.036 mmol) were mixed in a two-neck flask for 1 hour under Ar gas atmosphere, and then polymerization was conducted in an oil bath at 80° C. for 2 hours. Then, after terminating the reaction by placing the reactor in liquid nitrogen, the product was precipitated in excess 2-propanone solution. After dissolving the precipitated polymer again in DI water, a random copolymer (92-AA) was prepared by adding 100 mL of water containing 140 mmol of [Li][TFSI] onto the solution in a dropwise manner.

Figure 3:
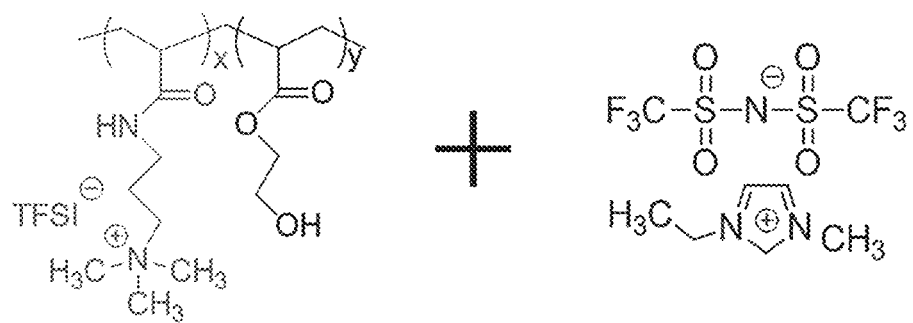
FIG. 3 shows a random copolymer comprising a cationic domain according to an exemplary embodiment of the present disclosure.

The prepared random copolymer 92-AA is shown in FIG. 3. In FIG. 3, the red part on the left side indicates an ionic domain and the right part on the right indicates a non-ionic domain. FIG. 3 shows the random copolymer comprising a cationic domain according to an exemplary embodiment of the present disclosure (with no methyl group). It shows the molecular structures of the polymer and an ionic liquid for embodying an ultrafast, super-stretchable device according to the present disclosure.

Example 2: Preparation of Random Copolymer (90-DA)

DAPA (28.15 g, 180.18 mmol), 2-HEA (0.212 g, 1.82 mmol) and the initiator AIBN (1 mg, 0.0061 mmol) were mixed in a two-neck flask together with dimethylacetamide (5 mL) for 1 hour under argon gas atmosphere. Then, after conducting polymerization in an oil bath at 80° C. for 10 hours, the product was precipitated in excess ether solution. After evaporating the solvent from the obtained polymer completely in a vacuum oven at 60° C., a random copolymer (90-DA) was prepared by repeating the purification process twice.

Figure 4:
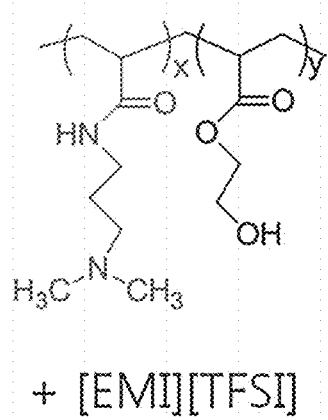
FIG. 4 shows a random copolymer not having a cationic domain according to a comparative example of the present disclosure.

The prepared random copolymer 90-DA is shown in FIG. 4. It can be compared with the random copolymer comprising a cationic domain prepared in Example 1.

Test Example: Characteristics of Random Copolymer

Figure 5A:
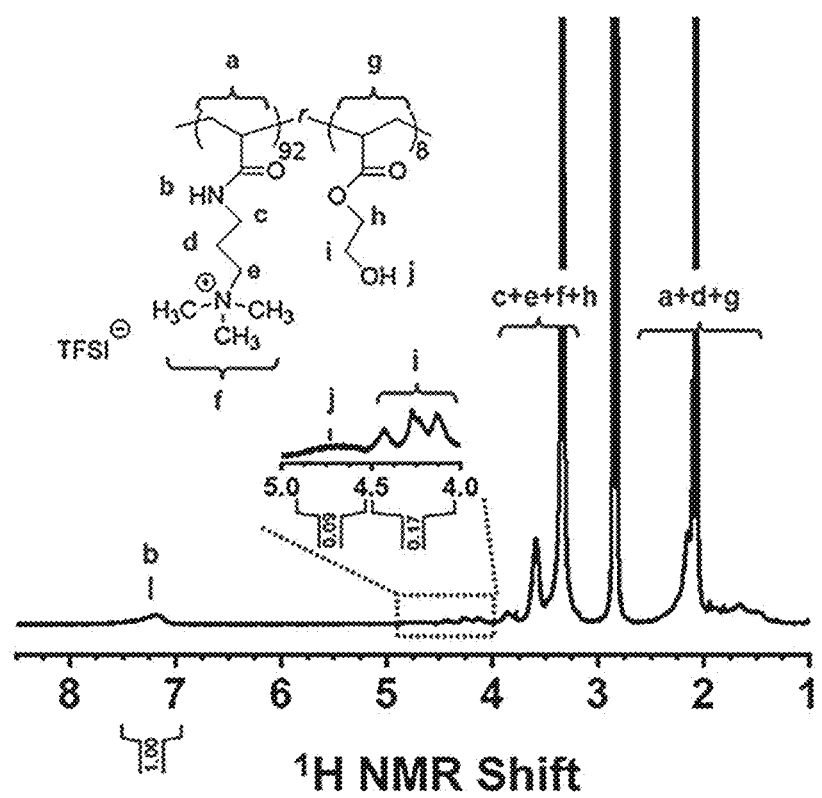
FIG. 5A shows the $^1H$ NMR (nuclear magnetic resonance) data of a random copolymer of Example 1 (92-AA).

FIG. 5A shows the $^1$H NMR (nuclear magnetic resonance) data of the random copolymer of Example 1 (92-AA). The ratio of the ionic domain and the non-ionic domain can be calculated from the area under the peaks in the NMR data. As a result, the ratios of the ionic domain and the non-ionic domain in the copolymer of Example 1 were about 92 mol % and about 8 mol %, respectively.

Figure 5B:
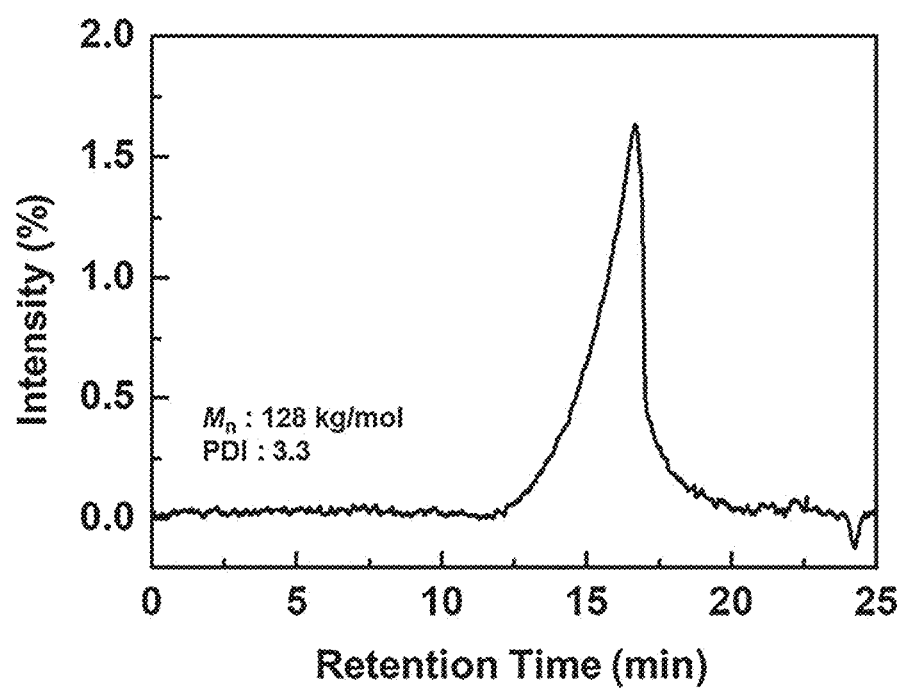
FIG. 5B shows the size-exclusion chromatography (SEC) data of a random copolymer of Example 1 (92-AA).

FIG. 5B shows the size-exclusion chromatography (SEC) data of the random copolymer of Example 1 (92-AA). The copolymer was found to have a molecular weight of about 128 kg/mol and a polydispersity index (PDI) of about 3.3.

Example 3: Preparation of Random Copolymer (92-AA)-Containing Polymer Gel Electrolyte (92-AA-IL)

A random copolymer (92-AA)-containing polymer gel electrolyte was prepared by blending the random copolymer of Example 1 (92-AA) with an ionic liquid ([Li][TFSI]).

Example 4: Preparation of Random Copolymer (90-DA)-Containing Polymer Gel Electrolyte (90-DA-IL)

A polymer gel electrolyte was prepared in the same manner as in Example 3 except that the random copolymer (90-DA) of Example 2 was used instead of the random copolymer of Example 1 (92-AA).

Test Example: Characterization of Polymer Gel Electrolyte (Ionoconductor)

Figure 6:
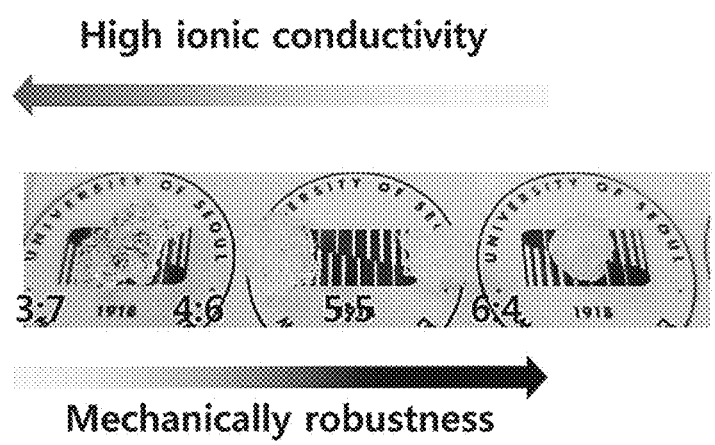
FIG. 6 shows the mechanical strength of an ion gel electrolyte depending on the composition of a random copolymer and an ionic liquid according to an exemplary embodiment of the present disclosure.

FIG. 6 shows the mechanical strength of an ion gel electrolyte depending on the composition of a random copolymer and an ionic liquid according to an exemplary embodiment of the present disclosure. It can be seen that the ionic conductivity and mechanical property of the random copolymer according to an exemplary embodiment of the present disclosure have a trade-off relationship depending on the compositions of the copolymer and the ionic liquid.

Figure 7:
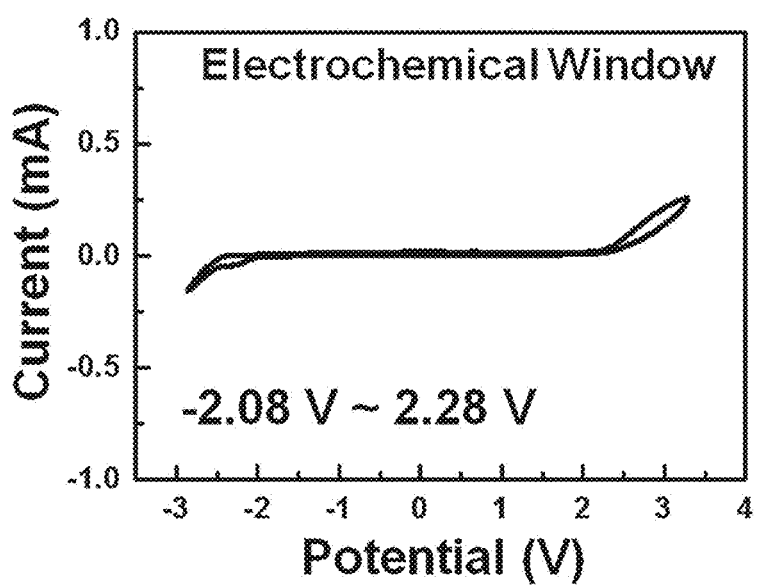
FIG. 7 shows the result of testing the electrochemical stability of an ion gel electrolyte using a random copolymer comprising a cationic domain according to an exemplary embodiment of the present disclosure.

FIG. 7 shows the result of testing the electrochemical stability of an ion gel electrolyte using a random copolymer comprising a cationic domain according to an exemplary embodiment of the present disclosure. It can be seen that it has electrochemical stability in a range of about −2.08 to 2.28 V.

Figure 8A:
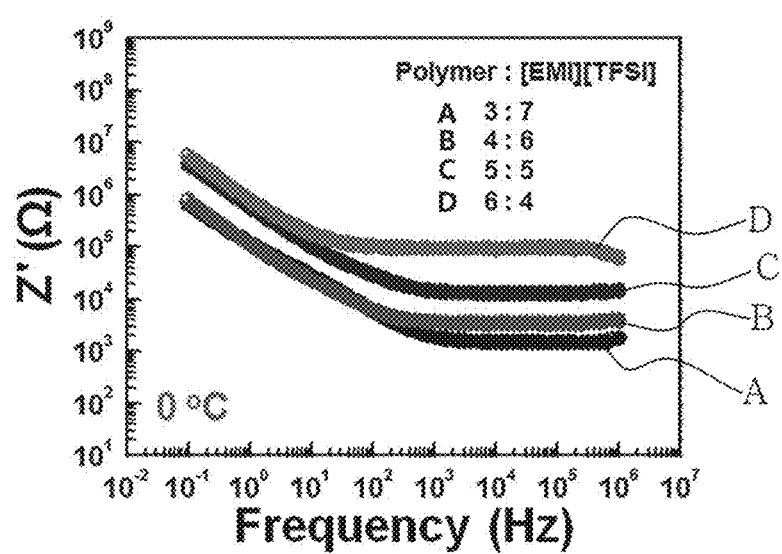
FIGS. 8A-8C show the result of measuring the ionic conductivity of an ion gel electrolyte using a random copolymer comprising a cationic domain according to an exemplary embodiment of the present disclosure depending on temperature and polymer composition.
Figure 8B:
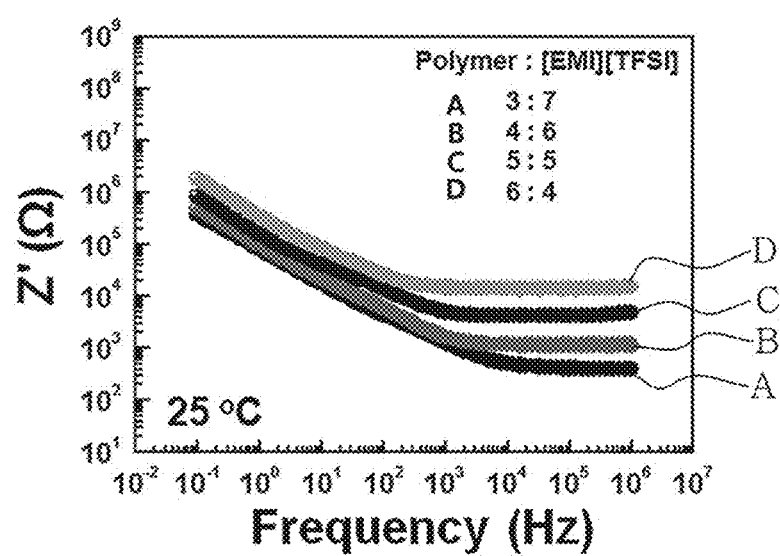
Figure 8C:
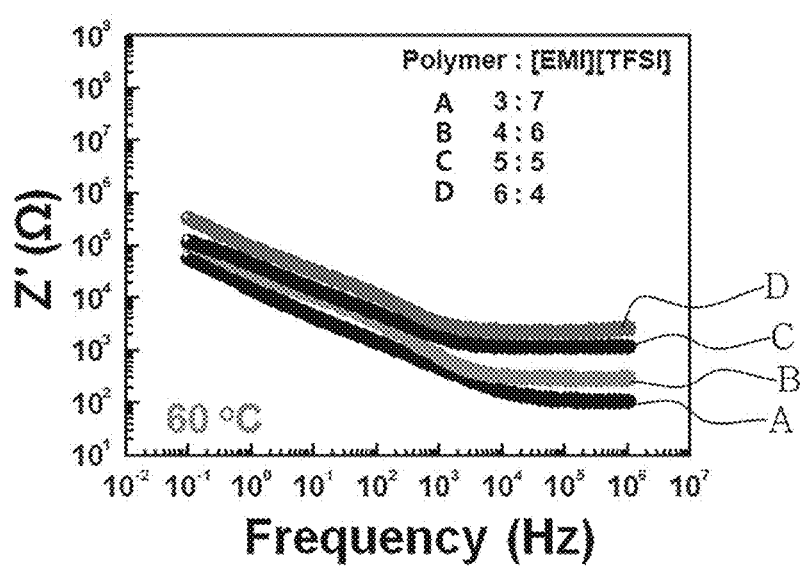

FIGS. 8A-8C show the electrochemical impedance spectroscopy (EIS) measurement result of an ion gel electrolyte using a random copolymer comprising a cationic domain according to an exemplary embodiment of the present disclosure.

Specifically, the impedance was 3:7≈1.10 mS/cm, 4:6≈0.46 mS/cm, 5:5≈0.12 mS/cm and 6:4≈0.02 mS/cm in FIG. 8A, 3:7≈3.89 mS/cm, 4:6≈1.39 mS/cm, 5:5≈0.38 mS/cm and 6:4≈0.12 mS/cm in FIG. 8B, 3:7≈15.2 mS/cm, 4:6≈5.47 mS/cm, 5:5≈1.33 mS/cm and 6:4≈0.61 mS/cm in FIG. 8C.

High and stable ionic conductivity were observed at all temperatures, and the ionic conductivity was increased with decreased content of the polymer (increased content of the ionic liquid).

Figure 9A:
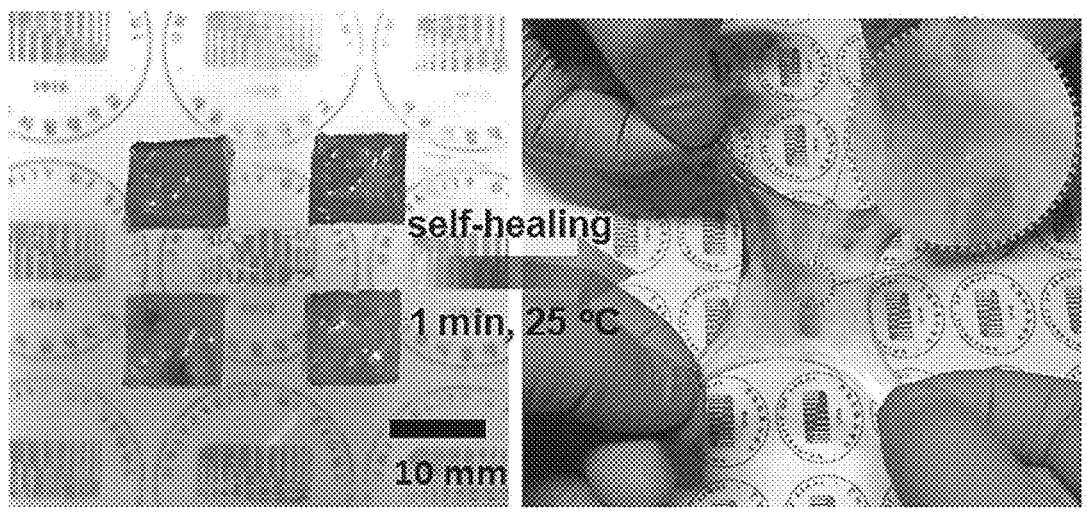
FIGS. 9A-9C show the fast self-healing property of an ion gel electrolyte using a random copolymer comprising a cationic domain according to an exemplary embodiment of the present disclosure.
Figure 9B:
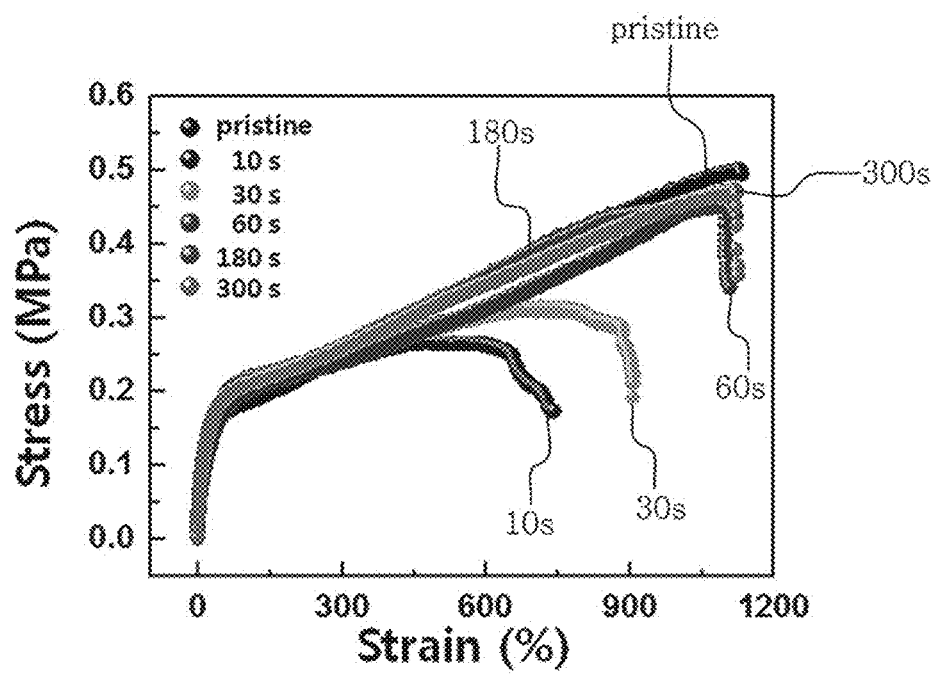
Figure 9C:
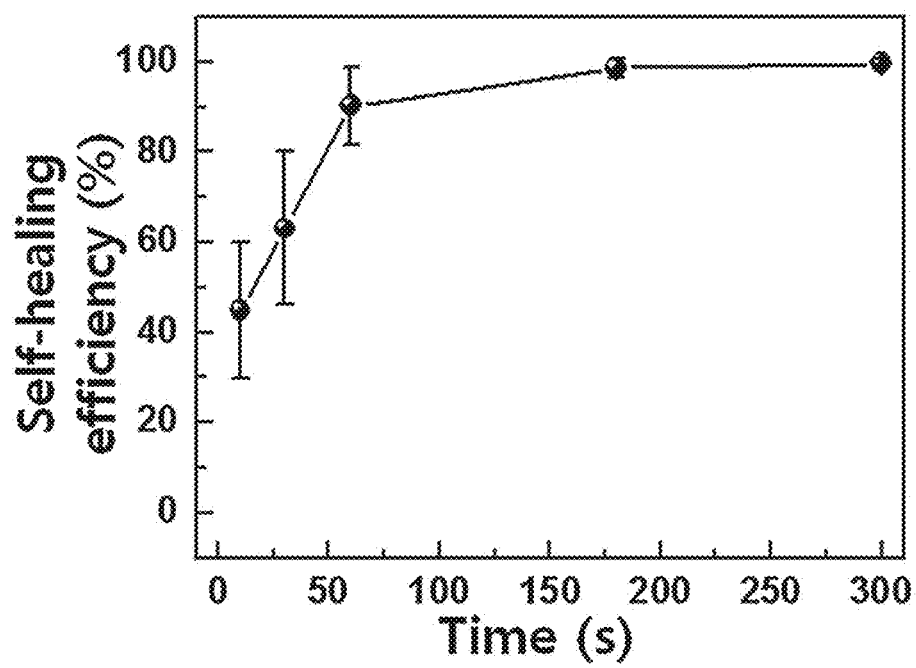

FIGS. 9A-9C show the fast self-healing property of an ion gel electrolyte using a random copolymer comprising a cationic domain according to an exemplary embodiment of the present disclosure.

Specifically, FIG. 9A shows the images of a PAAMP-r-PHEA-based ion gel stained with four pigments before and after self-healing.

FIG. 9B shows the stress-strain curve of the PAAMP-r-PHEA-based ion gel during the self-healing. It can be seen that self-healing is possible within 60 seconds.

FIG. 9C shows self-healing efficiency depending on self-healing time, which was obtained from the area under the curve of FIG. 9B. For example, it was calculated from area after self-healing/initial area×100(%).

Figure 10A:
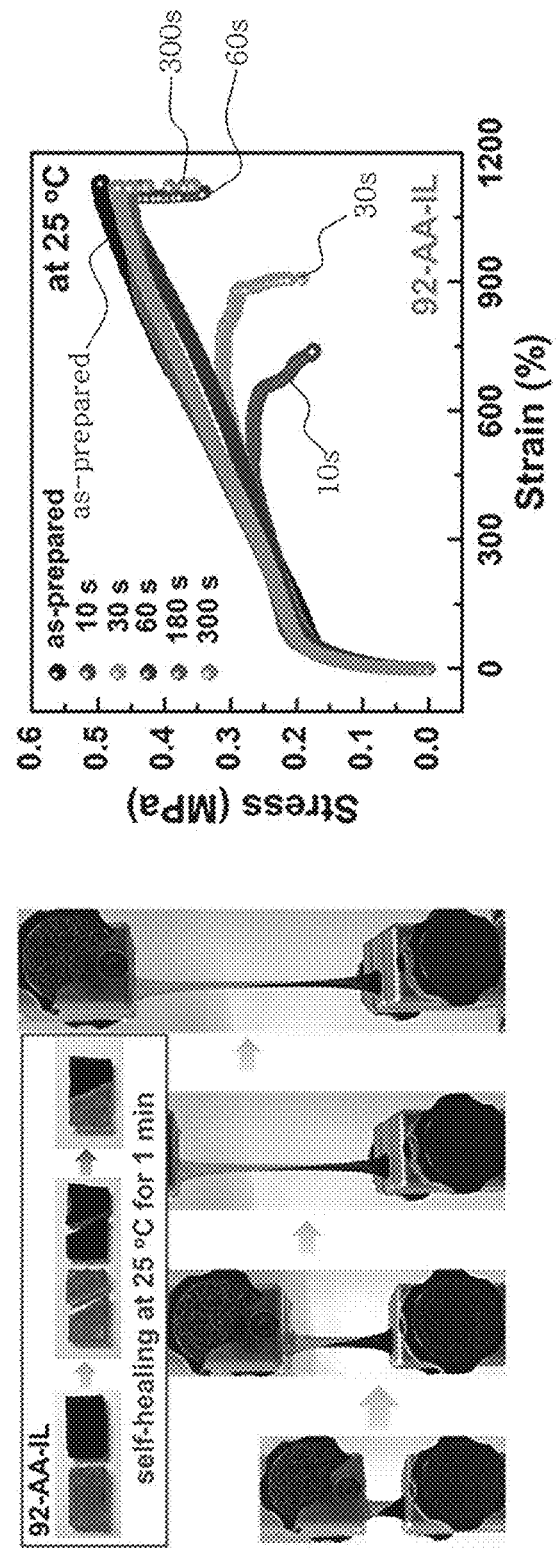
FIG. 10A shows the result of measuring the self-healing data of a polymer gel electrolyte of Example 3.
Figure 10B:
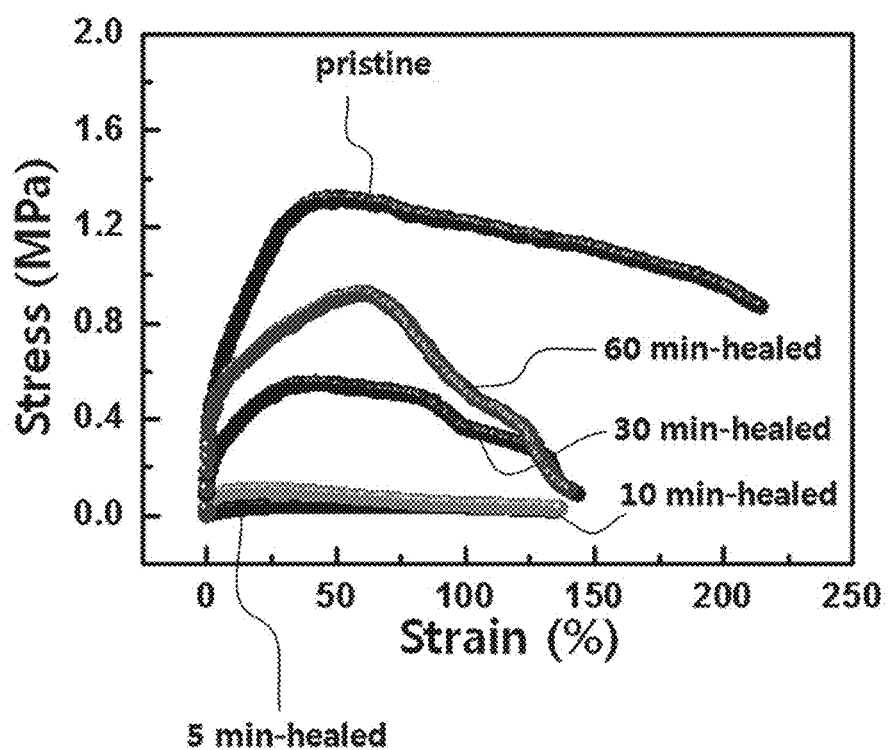
FIGS. 10B and 10C show the self-healing property of an ion gel electrolyte using a random copolymer not having a cationic domain according to a comparative example of the present disclosure.
Figure 10C:
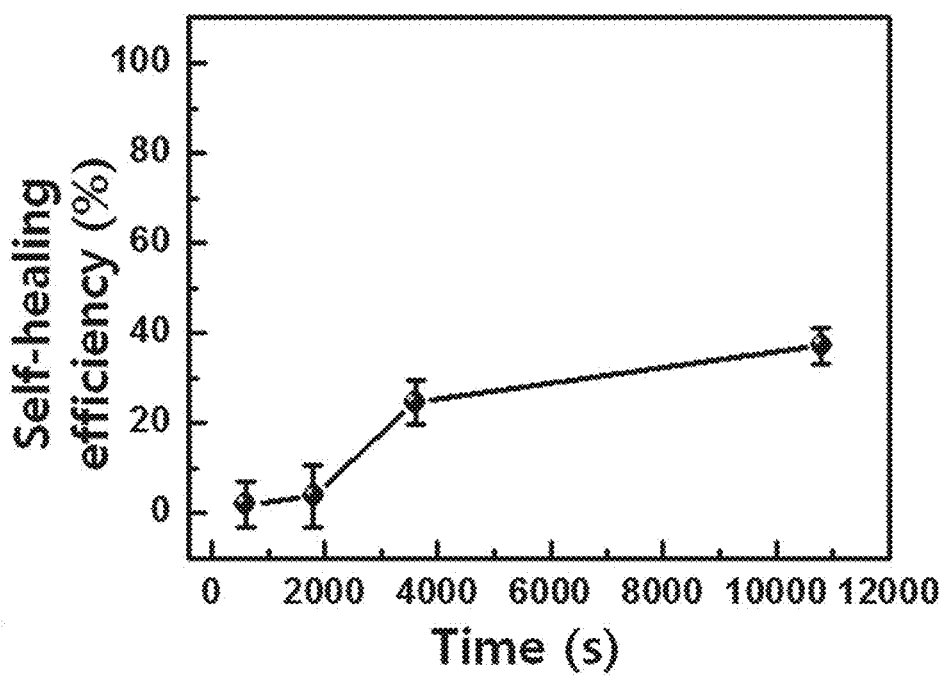

FIGS. 10B and 10C show the self-healing property of the ion gel electrolyte according to Example 4 (90-DA-IL) using a random copolymer having no cationic domain. It can be seen that self-healing occurs quickly only when the ionic domain is introduced.

Figure 11:
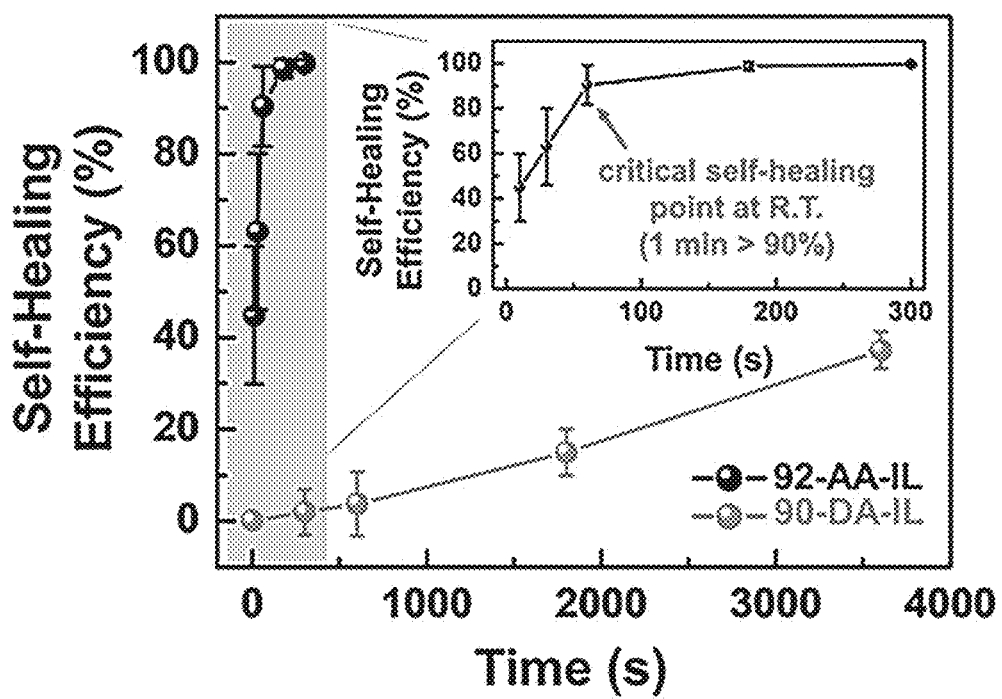
FIG. 11 shows the result of comparing the self-healing data of polymer gel electrolytes of Example 3 and Example 4.

From FIG. 11, it can be seen that, whereas the polymer gel electrolyte of Example 3 exhibits self-healing efficiency of 90% or higher within 1 minute at room temperature and normal pressure, the polymer gel electrolyte of Example 4 has poor self-healing ability. The self-healing efficiency (%) is calculated from the area under the curve before and after the self-healing.

Figure 12A:
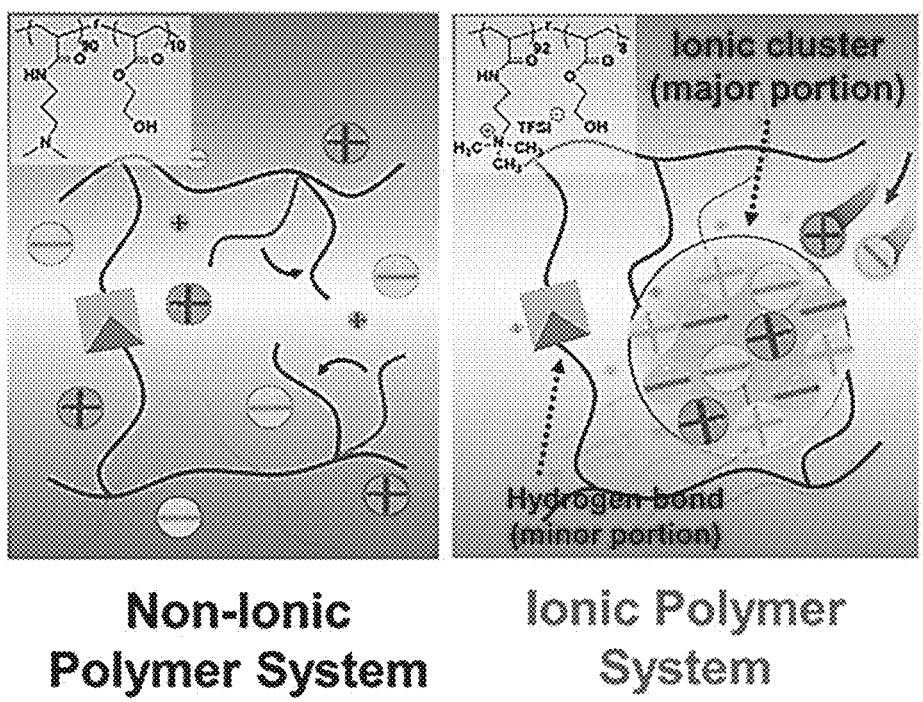
FIG. 12A schematically shows polymer gel electrolytes of Example 3 and Example 4.

FIG. 12A schematically shows the polymer gel electrolytes of Example 3 and Example 4. For the copolymer system having a non-ionic domain on the left side (Example 4), the ionic liquid and the copolymer are not bound to each other, and the ionic liquid acts as plasticizer. In contrast, for the copolymer system having an ionic domain on the right side (Example 3), the cation ([EMI]$^+$) and anion ([TFSI]$^-$) of the ionic liquid are bound to the ionic domain of the copolymer, thereby forming an ion cluster.

Figure 12B:
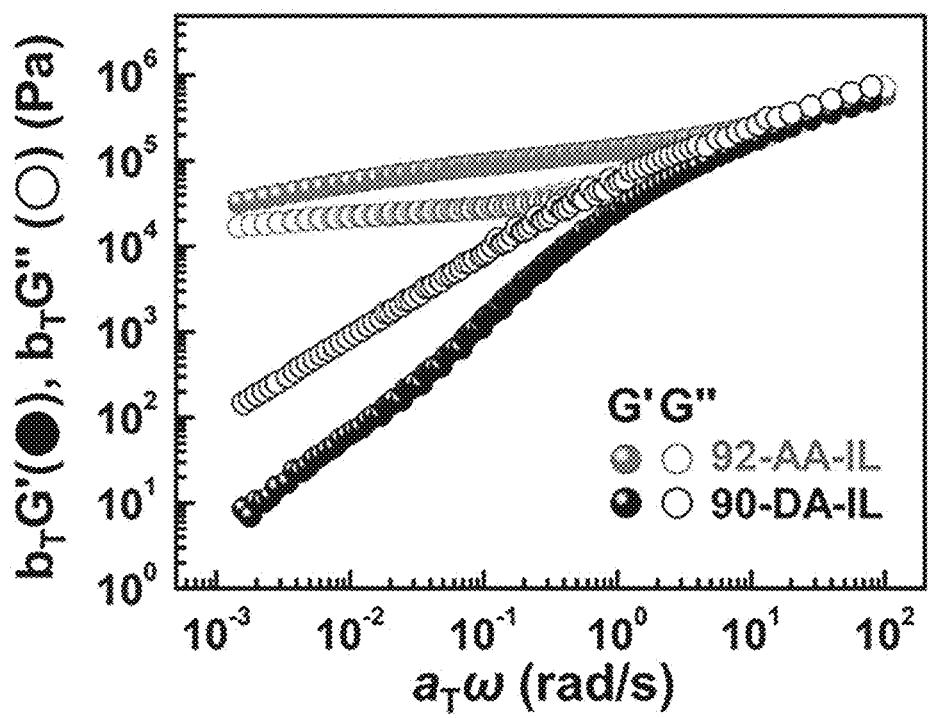
FIG. 12B shows the rheology data of polymer gel electrolytes of Example 3 and Example 4.

FIG. 12B shows the rheology data of the polymer gel electrolytes of Example 3 and Example 4. The rheology data were obtained by placing the gel of each example on a plate and measuring the storage modulus and loss modulus of the gel while applying shear force. The measurement was made while varying the angular frequency of the applied shear force in a range from 100 to 0.01 rad/s.

As a result, the disintegration of the ion gel was observed for Example 3 as the applied shear force was increased. In contrast, for Example 1, the ion gel was maintained without disintegration despite increased shear force because the ion cluster absorbed the external force.

Figure 13A:
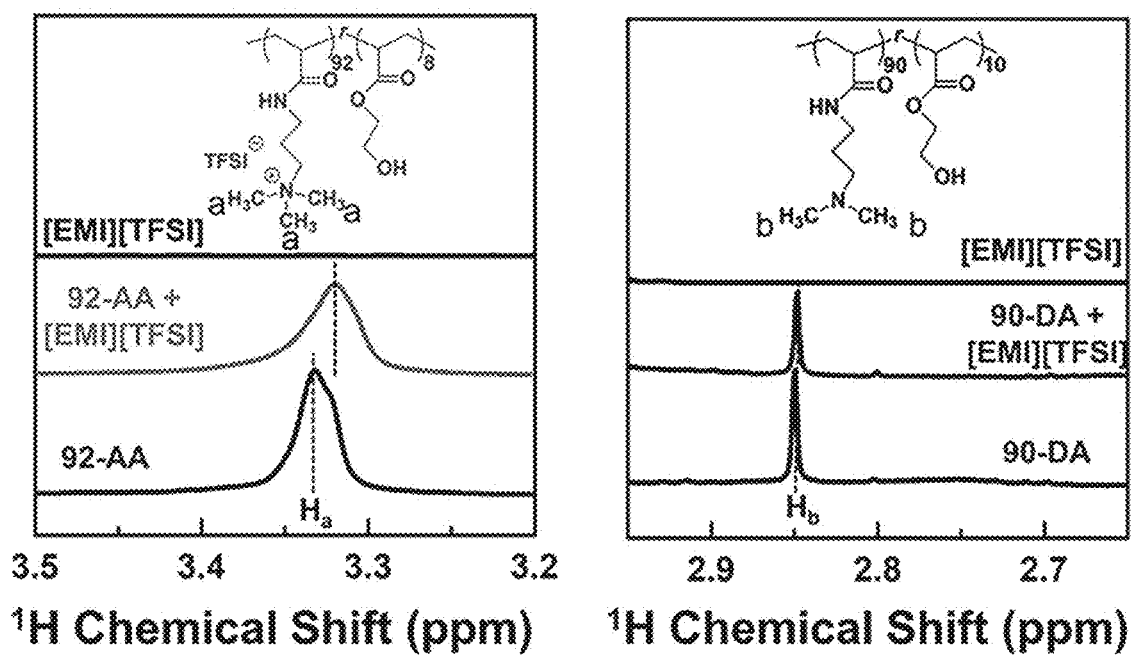
FIG. 13A shows the $^1$H NMR (nuclear magnetic resonance) measurement result of polymer gel electrolytes of Example 3 and Example 4.

FIG. 13A shows the $^1$H NMR (nuclear magnetic resonance) measurement result of the polymer gel electrolytes of Example 3 and Example 4. Specifically, the NMR results of the copolymers of Example 1 (92-AA) and Example 2 (90-DA) and the polymer gel electrolytes of Examples 3 and 4 are compared. It can be seen that, whereas the positions of peaks were changed (peak shift) depending on the presence of the ionic liquid for Example 3 (left), the peaks for Example 4 were not changed. Through this, it can be seen that an ion cluster (IC) is formed as the ionic moiety of the ionic domain is bound to the ionic liquid.

Figure 13B:
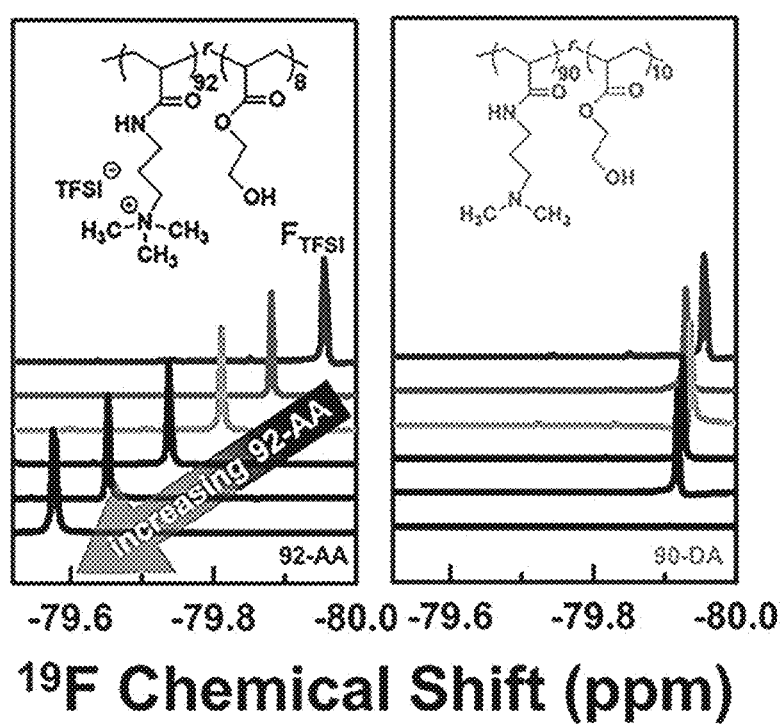
FIG. 13B shows the result of measuring the $^{19}$F NMR (nuclear magnetic resonance) measurement result of polymer gel electrolytes of Example 3 and Example 4.

FIG. 13B shows the result of measuring the $^{19}$F NMR (nuclear magnetic resonance) measurement result of the polymer gel electrolytes of Example 3 and Example 4. The peaks of the anion ([TFSI]$^-$) of the ionic liquid are shown. It can be seen that, whereas the positions of the peaks were almost the same depending on the content of the copolymer for Example 4 (right), significant peak shift is observed with increased copolymer content for Example 3 (left). Through this, it can be seen that an ion cluster (IC) is formed as the ionic moiety of the ionic domain is bound to the ionic liquid.

Figure 13C:
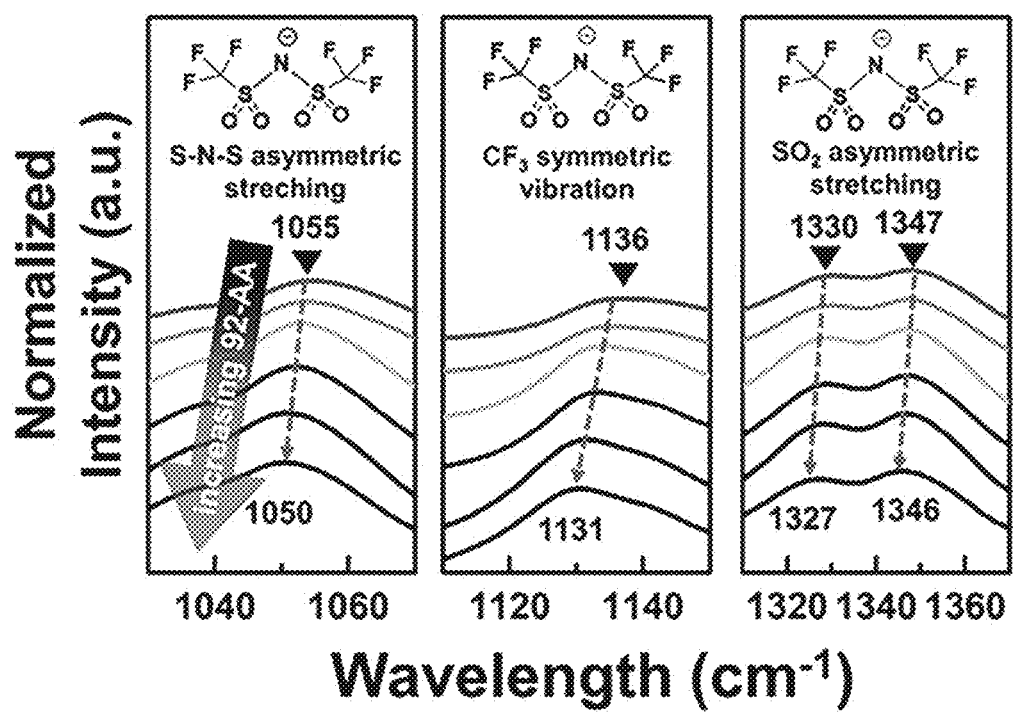
FIG. 13C shows the FT-IR (Fourier-transform infrared spectroscopy) data of a polymer gel electrolyte according to an exemplary embodiment of the present disclosure.

FIG. 13C shows FT-IR (Fourier-transform infrared spectroscopy) data. It can be seen that peak shift occurs due to the cationic group of the cationic polymer as in the NMR data.

Figure 14A:
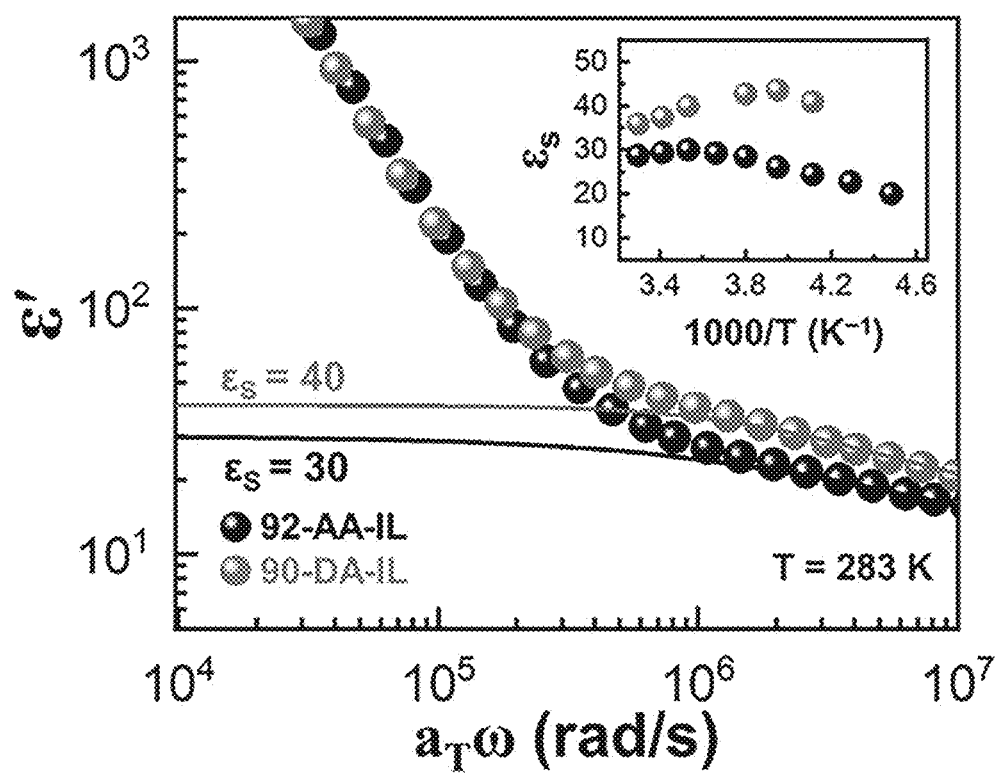
FIG. 14A shows the dielectric relaxation spectroscopy (DRS) data of a polymer gel electrolyte according to an exemplary embodiment of the present disclosure.

FIG. 14A shows the dielectric relaxation spectroscopy (DRS) data confirming the formation of ion clusters (ICs). The DRS data were obtained by placing the gel between stainless steel plates and measuring ion relaxation while applying a variable voltage (AC voltage in a frequency range from $10^8$ to $10^0$ rad/s). It was observed that the ion relaxation in the ion cluster occurred better in a higher frequency range. Example 3 (92-AA-IL) showed a lower static dielectric constant ($\varepsilon_s$) at 283 K, which is due to the ionic pendant groups involved in ionic aggregation.

FIG. 14B shows the result of measuring the glass transition temperature ($T_g$) of the polymer gel electrolytes of Examples 3 and 4. It can be seen that the glass transition temperature of Example 3 (92-AA-IL, −17.6° C.) is higher than that of Example 2 (90-DA-IL, −23.5° C.).

Figure 14C:
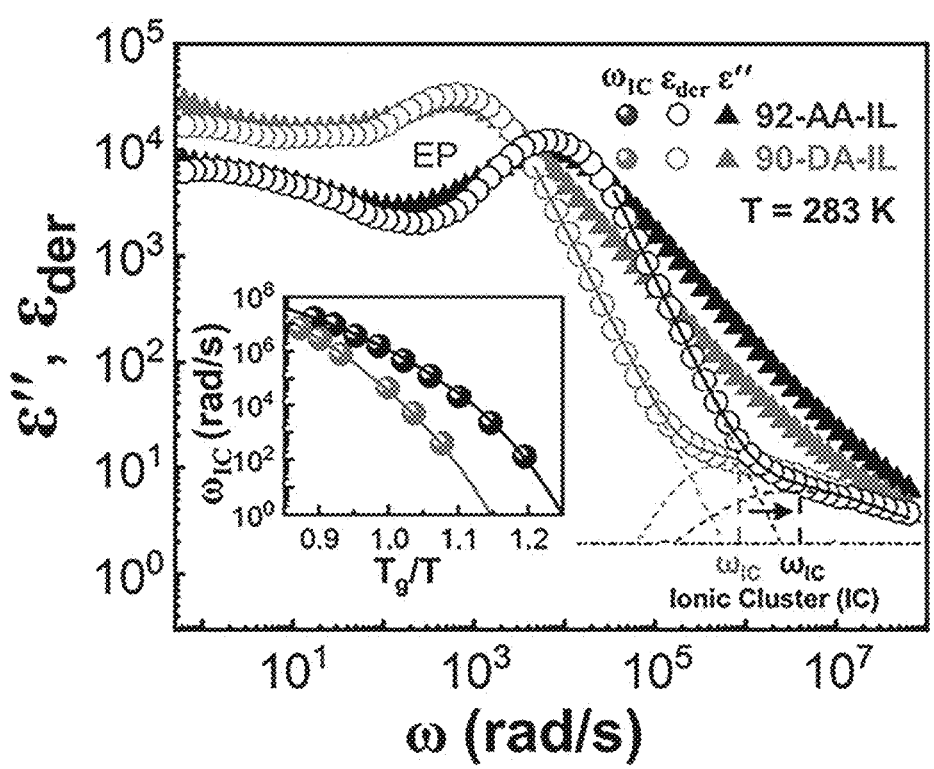
FIG. 14C shows the dielectric relaxation spectroscopy (DRS) data of polymer gel electrolytes according to an exemplary embodiment of the present disclosure.

It can be seen that, despite the higher glass transition temperature of Example 3 (92-AA-IL), IC relaxation occurs at a higher angular frequency in the dielectric derivative spectra (Eder) of FIG. 14C.

Figure 15:
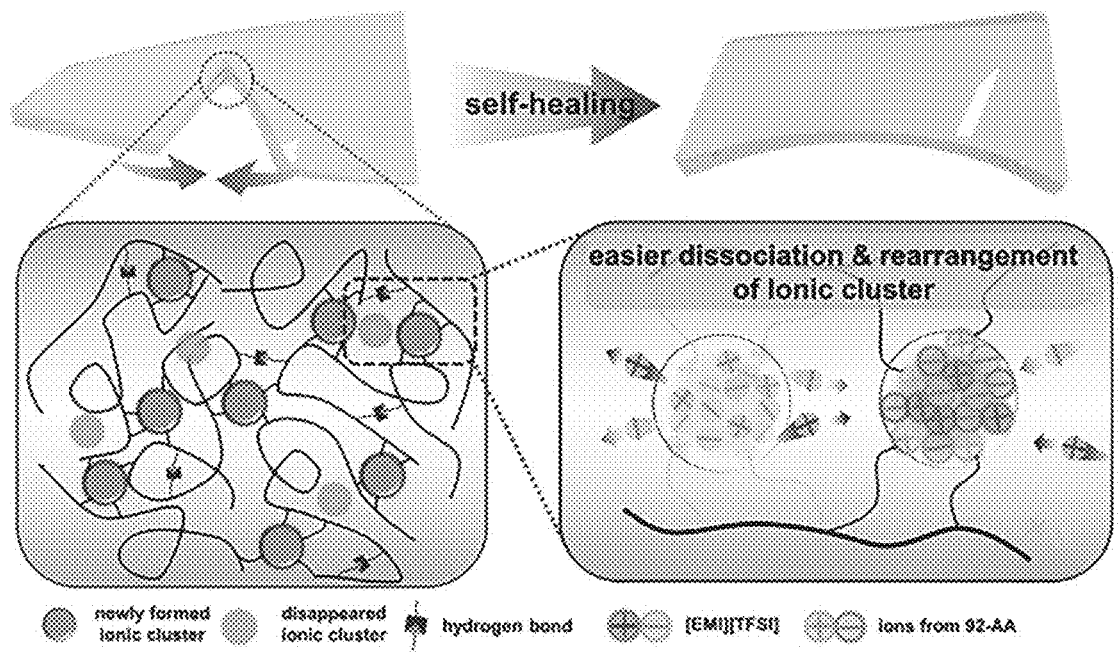
FIG. 15 schematically shows the process whereby self-healing occurs fast through relaxation of ion clusters (ICs).

From these data, it can be seen that the formation and dissociation of ion clusters (ICs) occur very quickly in the 92-AA-IL ionoconductor, suggesting that fast self-healing occurs through the IC relaxation (FIG. 15).

Figure 16A:
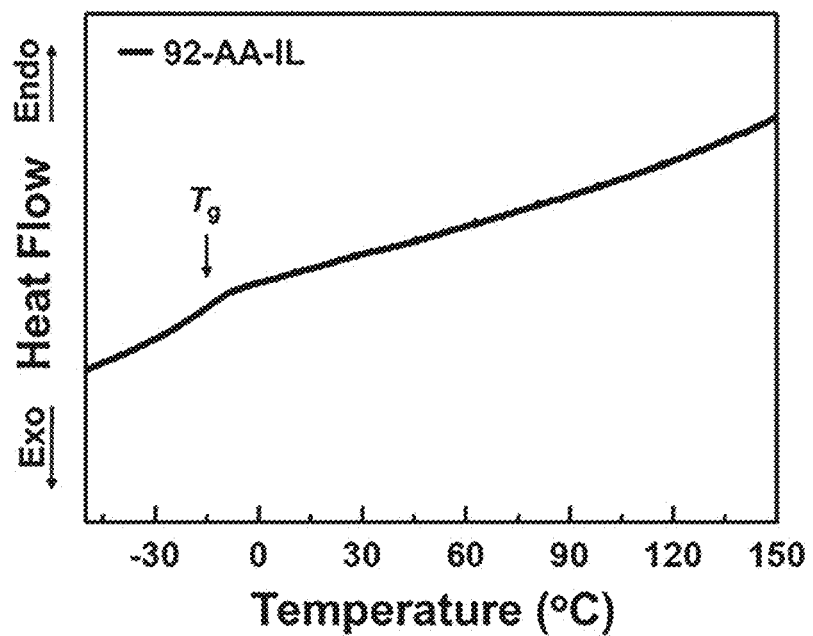
FIG. 16A shows the differential scanning calorimetry (DSC) result of a polymer gel electrolyte according to an exemplary embodiment of the present disclosure.
Figure 16B:
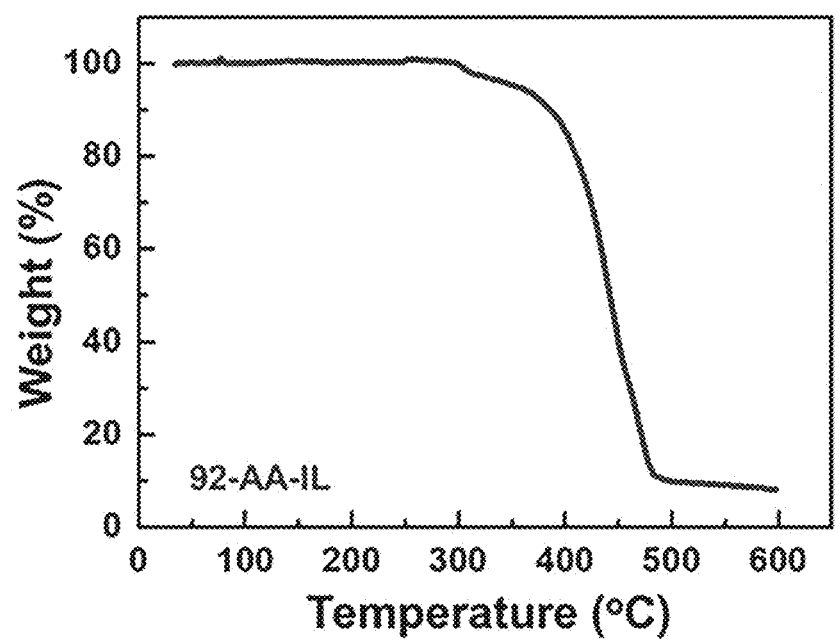
FIG. 16B shows the temperature stability of a polymer gel electrolyte according to an exemplary embodiment of the present disclosure.

As seen from FIG. 16A, a water hydrolysis peak was not observed near 100° C. for Example 3 (92-AA-IL), suggesting that the polymer gel electrolyte is not affected by water. In addition, stability was maintained up to about 340° C. (FIG. 16B).

Example 5: Preparation of Strain Sensor

After blending the 92-AA polymer of Example 1 with an ionic liquid at a ratio of 70:30 wt %:wt % using acetone as a co-solvent, the mixture was put in a rectangular mold (thickness: 300 μm, width: 10 mm, length: 30 mm) and the acetone was evaporated at 50° C. for 2 hours. Then, an ion gel with a rectangular shape was obtained by completely removing the solvent by drying in a vacuum oven at 100° C.

for 3 hours. A strain sensor was prepared by connecting electrodes on both ends of the ion gel.

Test Example: Characterization of Strain Sensor

Figure 17A:
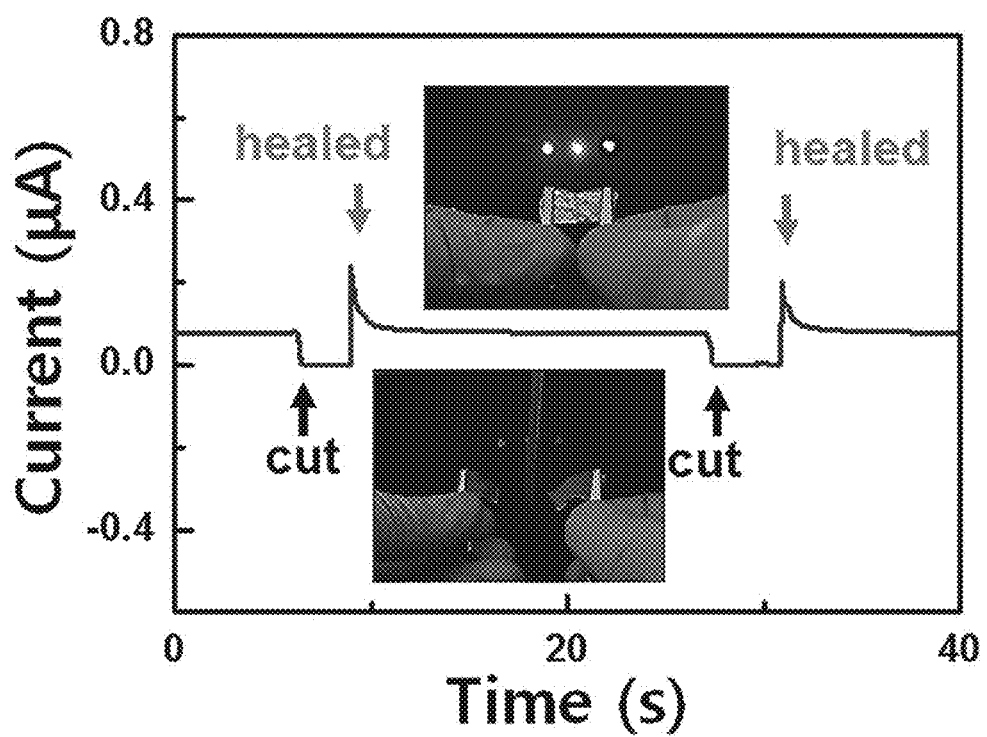
FIG. 17A shows the electrical characteristics of an electronic device using a random copolymer comprising a cationic domain according to an exemplary embodiment of the present disclosure after healing.

FIG. 17A shows the electrical characteristics of the electronic device using a random copolymer comprising a cationic domain according to an exemplary embodiment of the present disclosure after healing. Upon cutting, the current flowing through an LED lamp was decreased to 0 and the LED lamp was turned off. Then, after self-healing, the ionic domain healed in 6-7 seconds and the LED lamp was turned on again.

Figure 17B:
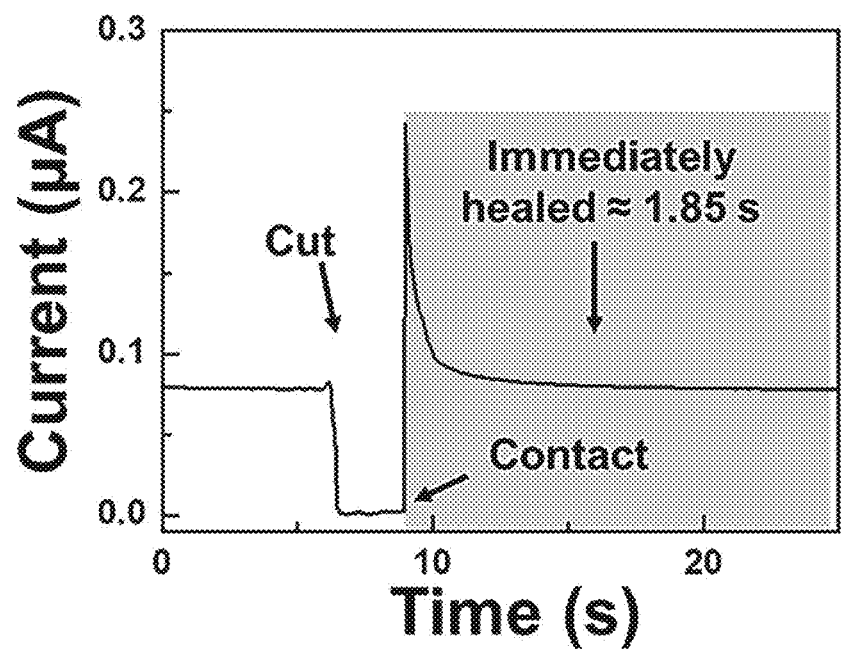
FIG. 17B shows the self-healing ability of a polymer gel electrolyte of Example 3 (92-AA-IL).

As seen from FIG. 17B, Example 3 (92-AA-IL) showed fast healing capacity of recovering original performance within 1.85 seconds.

Figure 17C:
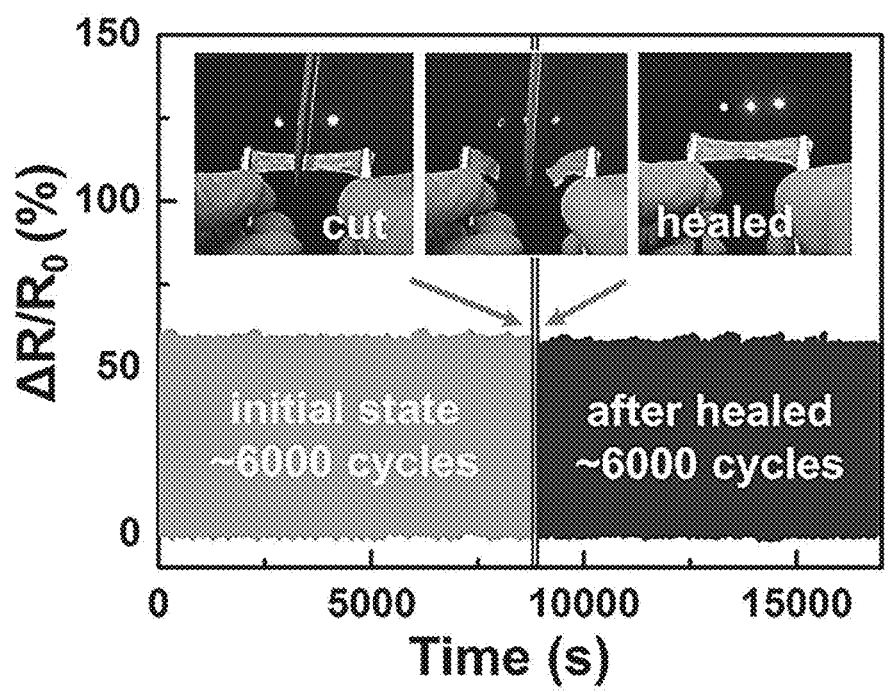
FIG. 17C shows that a polymer gel electrolyte of Example 3 (92-AA-IL) can be operated stably for about 6000 cycles before and after self-healing.
Figure 17D:
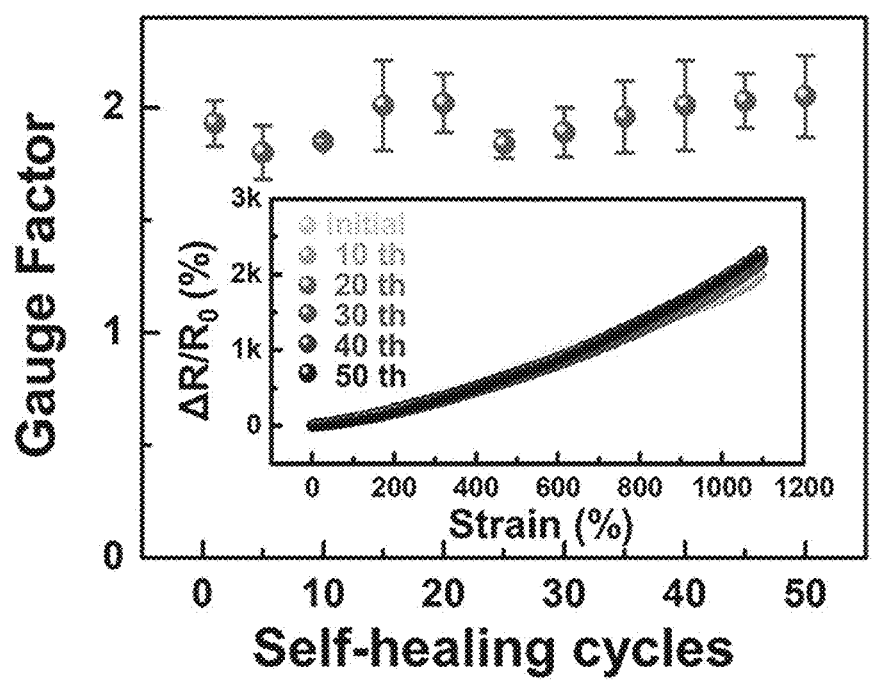
FIG. 17D shows that a polymer gel electrolyte of Example 3 (92-AA-IL) maintains a gauge factor above a certain level even after about 50 self-healing cycles.

It was confirmed that the ionic strain sensor can operate even after cut/healing for 6000 cycles (FIG. 17C) and a gauge factor above a certain level was maintained even after about 50 self-healing cycles (FIG. 17D).

Also, the polymer gel electrolyte was cut in half, kept at room temperature and normal pressure for 1 month, 2 months, 3 months or 6 months and then sensitivity was measured. As shown in FIG. 17E, the sensitivity was maintained over a certain level, confirming stable self-healing ability.

Figure 18B:
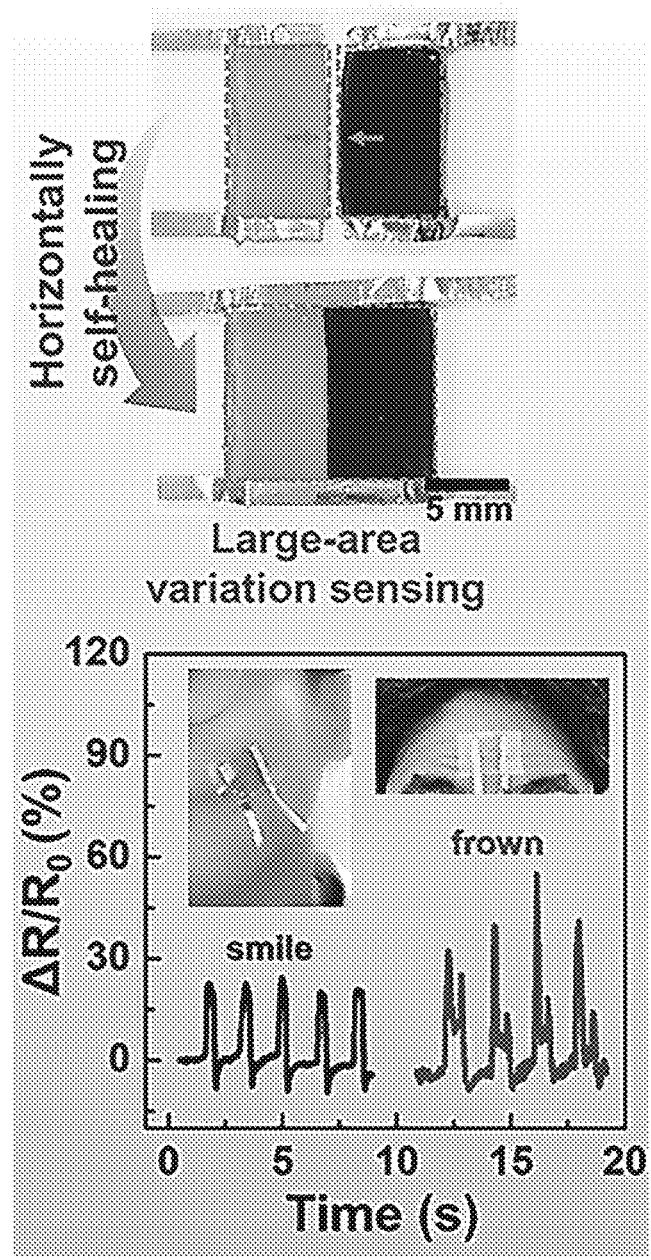

FIGS. 18A-18C show the performance of the strain sensor of Example 5.

In general, sensors attached to the human body should be prepared into various sizes depending on the parts to which they are attached. Especially, a sensor capable of covering a large area is necessary for the parts showing small changes such as facial expression or voice, and a long sensor is necessary for detecting the motion of the knee to which strain is applied over a long area (FIG. 18A).

The strain sensor of this example can be prepared into various sizes depending on the direction of self-healing of the ionoconductor. The facial expression could be detected through horizontal self-healing (FIG. 18B), and the motion of the knee could be detected through vertical self-healing (FIG. 18C).

Example 6: Preparation of Electroluminescent (EL) Device

Figure 19:
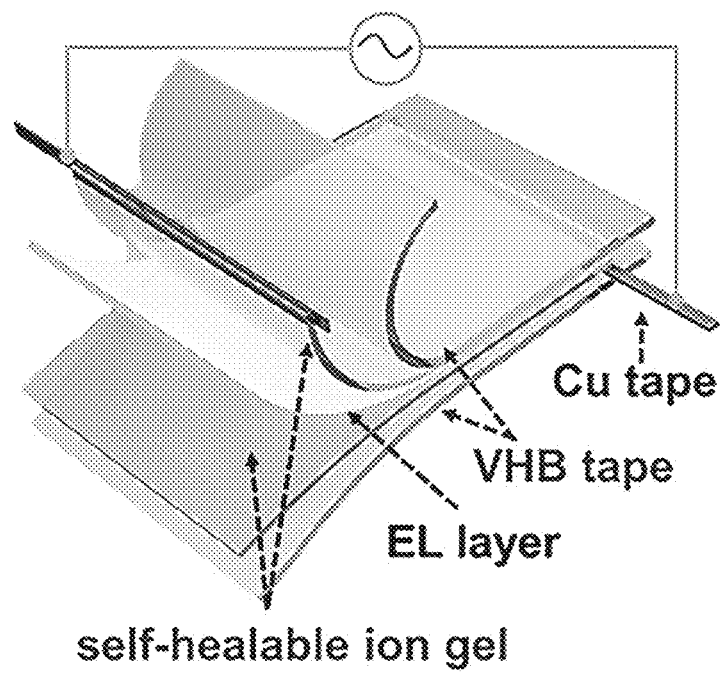
FIG. 19 schematically shows an electroluminescent device according to an exemplary embodiment of the present disclosure.

The self-healable ionoconductor of Example 3 was used as two electrodes and an elastomer layer comprising a ZnS:Cu material (which emits light when AC voltage of specific frequency is applied) was sandwiched therebetween. The color of the emitted light can be changed by changing the ZnS:Cu material (e.g. green: ZnS:Cu, blue: ZnS:Cu,Al). The prepared EL device is shown in FIG. 19.

Test Example: Characterization of Electroluminescent Device

Figure 20A:
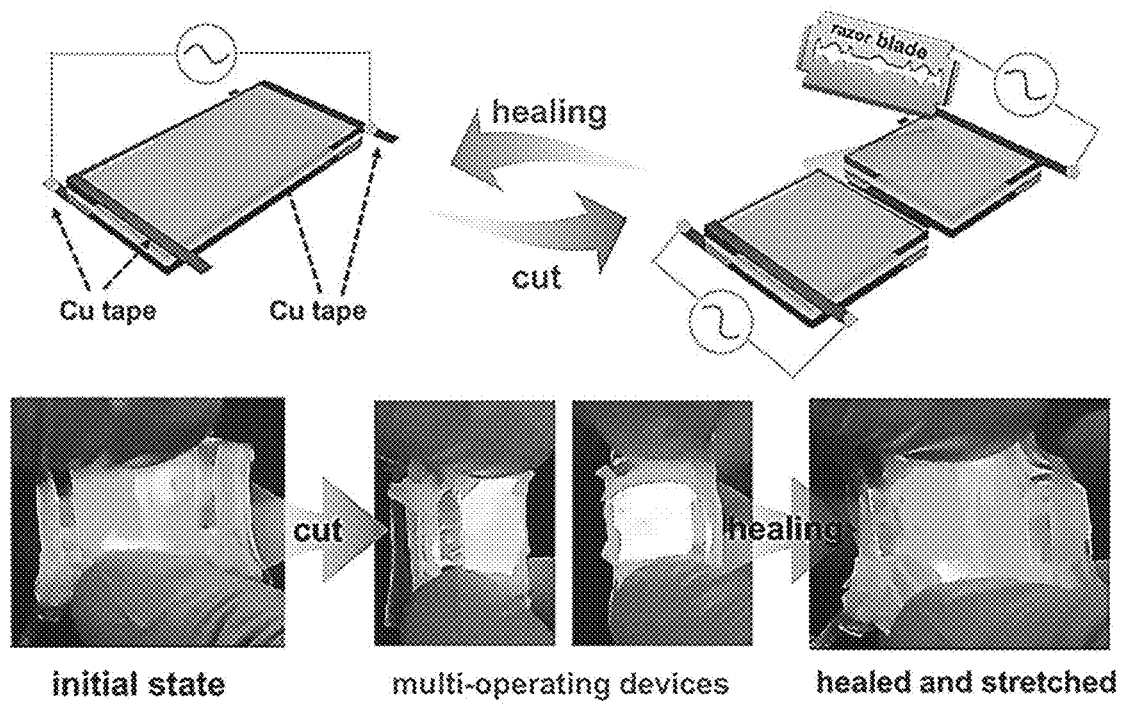
Figure 20C:
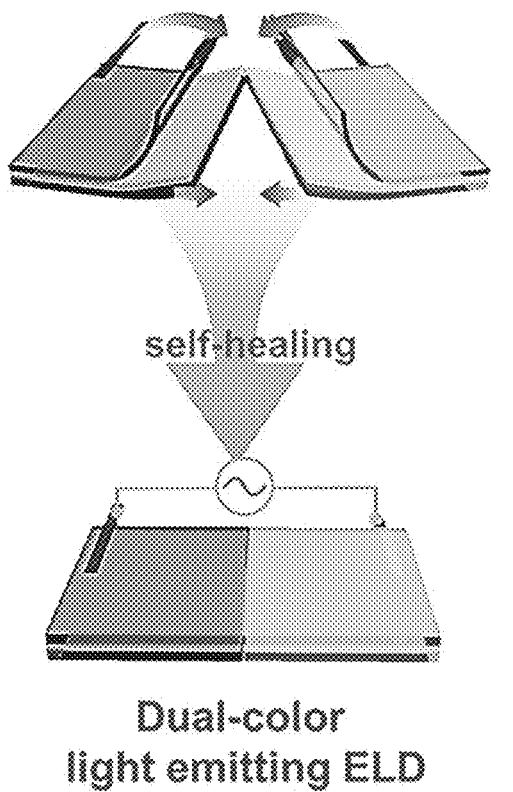
Figure 20C:
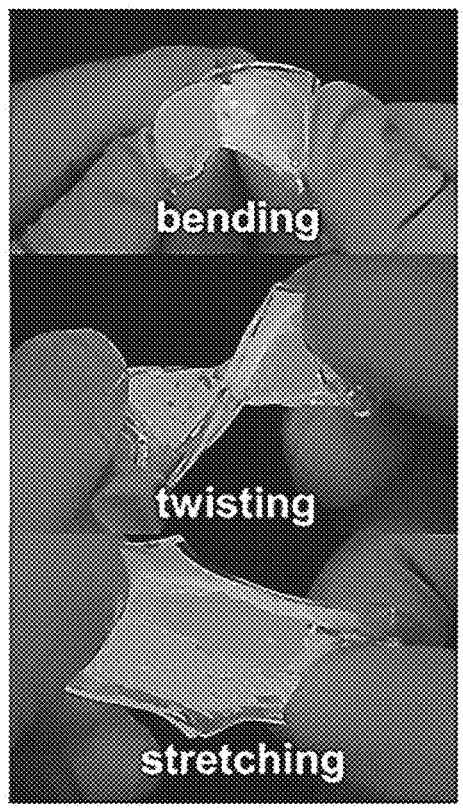

Because the EL device of Example 6 is self-healable unlike the existing EL devices, the device could operate stably even after cutting and healing (FIG. 20A). In particular, similar light intensity was observed even after cutting and healing for 10 times (FIG. 20B), and devices of different colors could operate well when they were attached into one device (FIG. 20C).

Figure 20D:
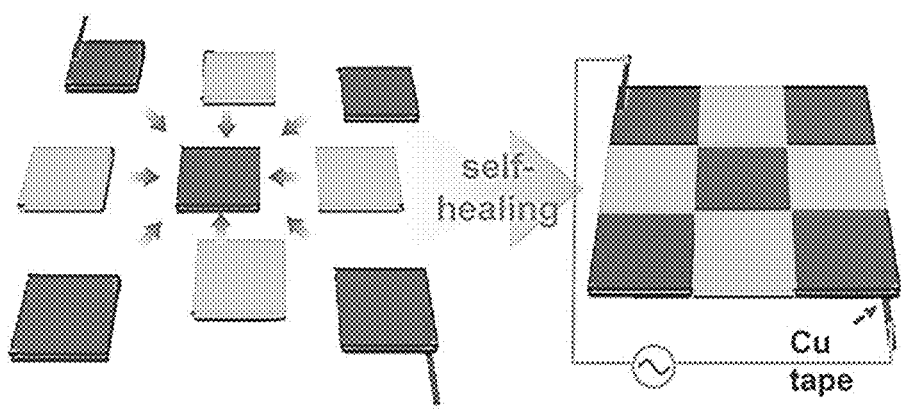
Figure 20D:
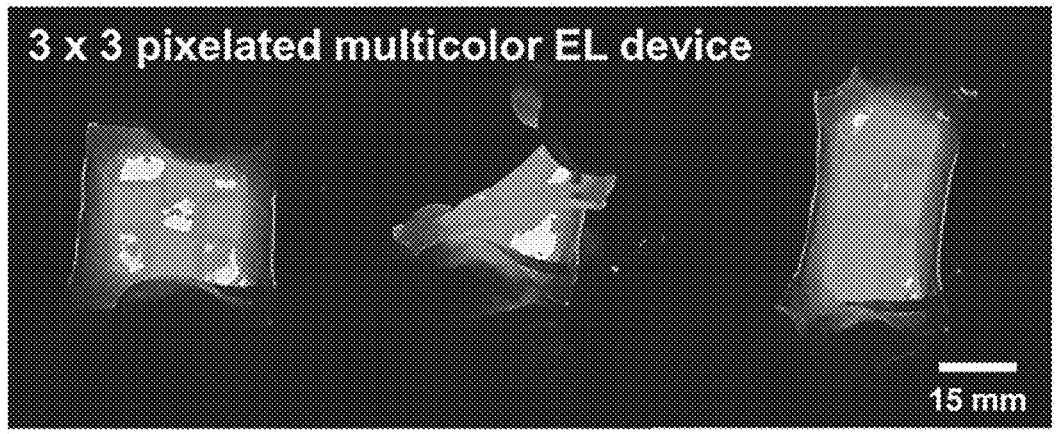

A 3×3 pixel device was prepared utilizing the advantage of fast and easy self-healing. The prepared device operated stably even after deformation such as folding, bending and stretching (FIG. 20D).

FIGS. 21A-21D show the luminescence characteristics of the single-color EL devices of Example 6.

As seen from FIG. 21A, the light intensity of both the green- and blue-light emitting devices was increased with the increase of voltage, and the highest light intensity was observed around AC 200 $V_{pp}$.

Figure 21B:
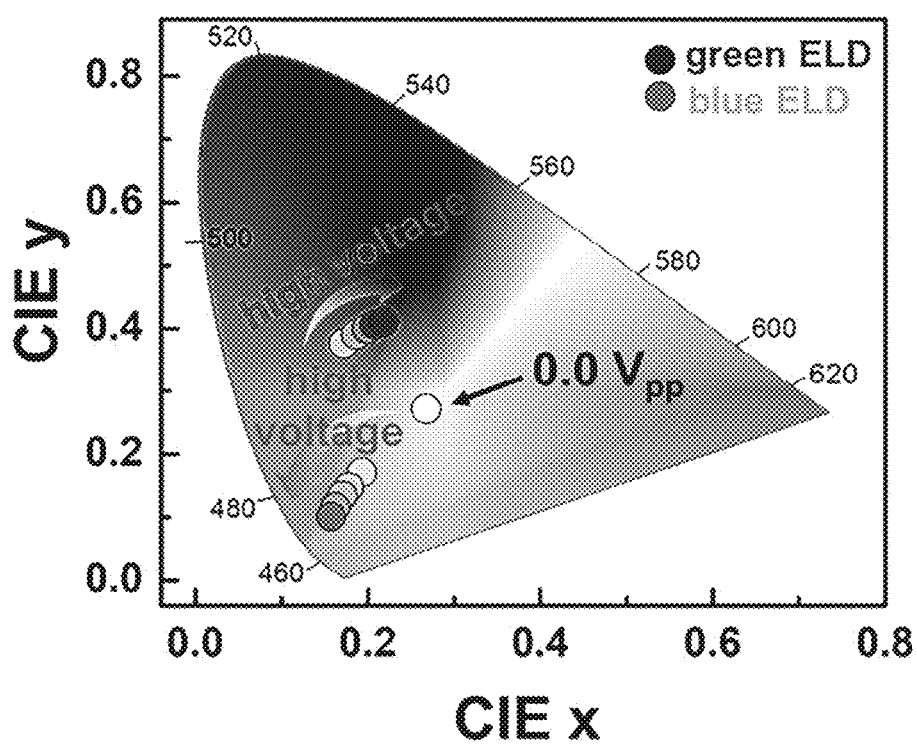
Figure 21C:
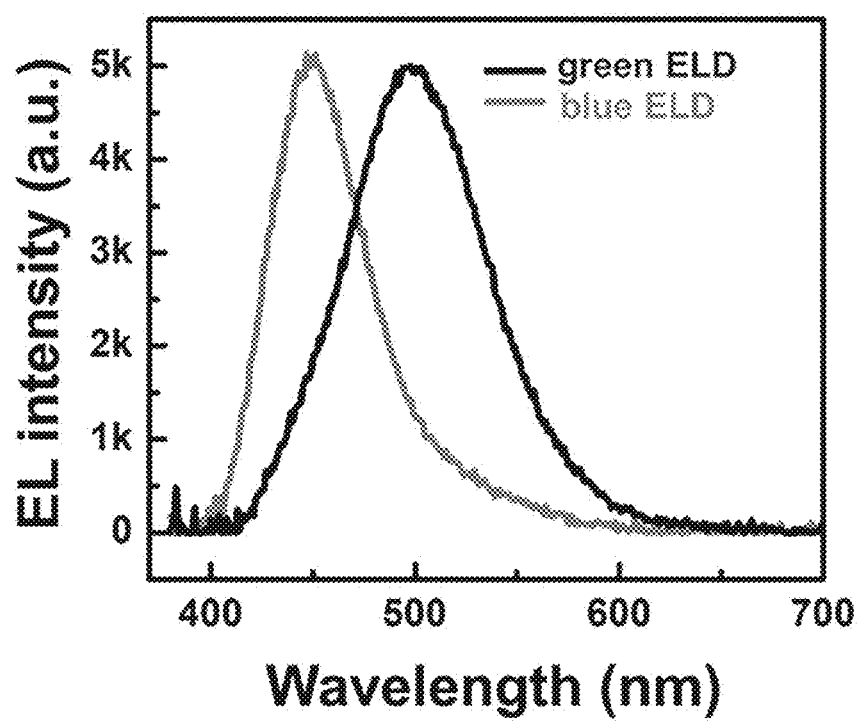

The CIELAB color coordinate data shown in FIG. 21B show that more distinct green and blue colors were achieved as the voltage was increased. The highest light emission was observed at the wavelengths of 450 nm and 500 nm (FIG. 21C).

In addition, as seen from FIG. 21D, when voltage was set to 200 $V_{pp}$ and frequency was varied, the intensity of emitted light was increased up to 30 kHz and then decreased.

Accordingly, it can be seen that the green- and blue-light emitting EL devices according to the present disclosure are optimized under the operating condition of AC 200 $V_{pp}$ and 30 kHz.

To conclude, it can be seen that the ionically conductive path of the self-healable ion gel electrolyte is self-healed in 6-7 seconds and the mechanical strength is self-healed in 1 minute.

The PAAMP-r-PHEA-based ion gel that can self-heal within 1 minute is highly applicable to next-generation wearable electronic devices which can lose their original characteristics due to mechanical deformation. In particular, the ion gel developed according to an exemplary embodiment of the present disclosure has super-stretchability of 1100% and can also be used to establish a next-generation human-robot interface through measurement of change in resistance in response to external stimulation.

For example, the random copolymer polymer can be produced easily through free radical polymerization without an additional process. The enthalpy-driven salvation, the hydrogen bonding through hydroxyl groups and ionic interaction of the ionic domain and the IL provide the self-healing ability faster than that of any previously reported device. In addition, stable self-healing ability at low temperature can be provided even after hundreds of deformation under the condition of room temperature and normal pressure.

Whereas the existing hydrogel materials exhibiting self-healing ability require self-healing time of several seconds to several minutes, self-healing is normally impossible at low temperature and an additional process is required. And, ion gels are disadvantageous in that they require self-healing time of tens of minutes to several hours. However, since the ultrafast self-healing ion gel developed according to an exemplary embodiment of the present disclosure can self-heal 90% or more in 1 minute and exhibits self-healing ability even at low temperature, it can be applied to electronic devices requiring fast self-healing ability.

In addition, the ion gel can be applied to future electronic skin since it has a simple structure, can be prepared easily and allows stable measurement of changes. It can also be used in the next-generation human-robot interface as a sensor for sensitively detecting pressure/strain changes for the human body, medical equipment and robots.

The easy preparation of the random copolymer through free radical polymerization and the preparation of the ion gel through a solution process allow large-scale production and can ensure economical efficiency. In addition, since the gel itself can act as a conductor, it is not necessary to add another conductor and the production process can be simplified. Furthermore, the ion gel does not require a special post-treatment process at room temperature and normal pressure and can be stored and used easily for a long period of time.

Besides, since the self-healing ability can be tested depending on the molecular design of the polymer, a basis may be provided for the elucidation of the principle of the ultrafast self-healing ability and molecular design of the polymer.

The examples of the present disclosure described about should be interpreted as limiting the technical idea of the present disclosure. The scope of the present disclosure is limited only by the description of claims, and those having ordinary knowledge in the art to which the present disclosure belongs will be able to change and modify the technical idea of the present disclosure in various forms. It will be obvious to those having ordinary knowledge that such changes and modifications are included in the scope of the present disclosure.

What is claimed is:

1. A polymer gel electrolyte comprising:
   a copolymer comprising an ionic domain and a non-ionic domain; and
   an ionic liquid,
   which has a plurality of ion clusters (ICs) formed as an ionic moiety of the ionic domain is bonded to the ionic liquid, wherein the copolymer is a random copolymer represented by Chemical Formula 1:

[Chemical Formula 1]

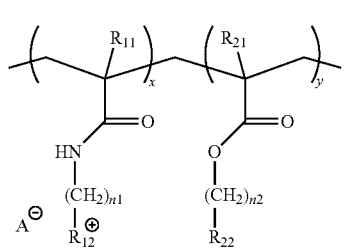

wherein each of $R_{11}$ and $R_{21}$ is independently an alkyl group, $R_{12}$ is a cationic functional group, and $R_{22}$ comprises a hydroxyl group or hydrogen (H), and
each of n1 and n2 is independently is an integer from 1 to 8.

2. The polymer gel electrolyte according to claim 1, wherein each of $R_{11}$ and $R_{21}$ is independently selected from hydrogen (H), a methyl group ($CH_3$), an ethyl group ($C_2H_5$), a propyl group ($C_3H_7$), a butyl group ($C_4H_9$), a pentyl group ($C_5H_{11}$) and a hexyl group ($C_6H_{13}$), and
$R_{12}$ is selected from an ammonium group, an imidazolium group, a diallyldimethylammonium group, a pyridinium group and a phosphonium group.

3. The polymer gel electrolyte according to claim 1, wherein the copolymer is a random copolymer represented by Chemical Formula 2:

[Chemical Formula 2]

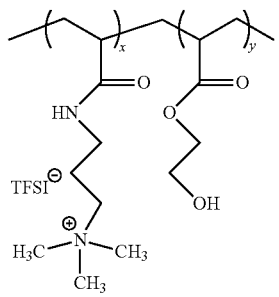

4. The polymer gel electrolyte according to claim 1, wherein the polymer gel electrolyte self-heals through formation and dissociation of ion clusters.

5. The polymer gel electrolyte according to claim 1, wherein a mole fraction of the ionic domain and the non-ionic domain in the copolymer is in a range from 80:20 to 95:5.

6. The polymer gel electrolyte according to claim 1, wherein the ionic liquid is one or more selected from N-methyl-N-butyl-pyrrolidinium bistrifluoromethylsulfonylimide ([$P_{14}$][TFSI]), 1-ethyl-3-methylimidazolium bis(trifluoromethylsulfonyl)imide ([EMI][TFSI]), 1-ethyl-3-methylimidazolium hexafluorophosphate ([EMI][PF6]), 1-ethyl-3-methylimidazolium tetrafluoroborate ([EMI][BF4]), 1-butyl-3-methylimidazolium bis(trifluoromethylsulfonyl)imide ([BMI][TFSI]), 1-butyl-3-methylimidazolium hexafluorophosphate ([BMI][PF6]), 1-butyl-3-methylimidazolium tetrafluoroborate ([BMI][BF4]), 1-butyl-trimethylammonium bis(trifluoromethylsulfonyl)imide ([N1114][TFSI]) and methylpropylpyrrolidinium bis(trifluoromethylsulfonyl)imide ([PYR13][TFSI]).

7. The polymer gel electrolyte according to claim 1, wherein a molar ratio of the copolymer and the ionic liquid is in a range from 3:7 to 7:3.

8. The polymer gel electrolyte according to claim 1, wherein the polymer gel electrolyte undergoes ion relaxation when a variable voltage (AC voltage) in a frequency range from $10^1$ to $10^7$ rad/s is applied in dielectric relaxation spectroscopy (DRS).

9. The polymer gel electrolyte according to claim 1, wherein the polymer gel electrolyte has a glass transition temperature ($T_g$) of −20° C. or higher.

10. The polymer gel electrolyte according to claim 1, wherein the polymer gel electrolyte exhibits self-healing efficiency of 90% or higher within 1 minute under the condition of room temperature and normal pressure.

11. An electronic device comprising the gel electrolyte according to claim 1.

12. The electronic device according to claim 11, wherein the electronic device is a strain sensor or an electroluminescent device.

* * * * *